US 9,212,899 B2

(12) United States Patent
Johnson et al.

(10) Patent No.: US 9,212,899 B2
(45) Date of Patent: Dec. 15, 2015

(54) IMAGING, FABRICATION AND MEASUREMENT SYSTEMS AND METHODS

(75) Inventors: Greg Johnson, Boulder, CO (US); Ed Dowski, Lafayette, CO (US); Brad Sissom, Boulder, CO (US)

(73) Assignee: ASCENTIA IMAGING, INC., Boulder, CO (US)

( * ) Notice: Subject to any disclaimer, the term of this patent is extended or adjusted under 35 U.S.C. 154(b) by 1047 days.

(21) Appl. No.: 13/233,563

(22) Filed: Sep. 15, 2011

(65) Prior Publication Data

US 2012/0062708 A1 Mar. 15, 2012

Related U.S. Application Data

(60) Provisional application No. 61/403,396, filed on Sep. 15, 2010, provisional application No. 61/571,205, filed on Jun. 22, 2011, provisional application No. 61/574,776, filed on Aug. 9, 2011, provisional application No. 61/574,910, filed on Aug. 11, 2011.

(51) Int. Cl.
*G01B 11/03* (2006.01)
*G03F 9/00* (2006.01)
*G02B 13/00* (2006.01)
*G02B 13/06* (2006.01)

(52) U.S. Cl.
CPC ............. *G01B 11/03* (2013.01); *G03F 9/7042* (2013.01); *G02B 13/008* (2013.01); *G02B 13/0035* (2013.01); *G02B 13/06* (2013.01); *Y10T 29/49124* (2015.01); *Y10T 29/52* (2015.01)

(58) Field of Classification Search
CPC .. G01B 11/03; G02B 13/0035; G02B 13/008; G02B 13/06; G03F 9/7042; Y10T 29/49124; Y10T 29/52

See application file for complete search history.

(56) References Cited

U.S. PATENT DOCUMENTS

| | | | |
|---|---|---|---|
| 6,184,974 B1 * | 2/2001 | Neal et al. | 356/121 |
| 6,363,168 B1 | 3/2002 | Kakuma | |
| 6,653,030 B2 * | 11/2003 | Mei et al. | 430/5 |
| 7,248,407 B2 * | 7/2007 | Kwon et al. | 359/455 |
| 7,256,895 B2 * | 8/2007 | Castonguay | 356/511 |
| 7,295,314 B1 | 11/2007 | Spady et al. | |

(Continued)

OTHER PUBLICATIONS

Bruckner, A.. et al., "A Multi Aperture Approach to Wafer-Level Camera Lenses", "MOEMS and Miniaturized Systems X", Jan. 27, 2011, p. 10 vol. 7930, No. 79300B, Publisher: Proc. of SPIE Photonics W., Published in: US.

(Continued)

*Primary Examiner* — Sath V Perungavoor
*Assistant Examiner* — Peter D Le
(74) *Attorney, Agent, or Firm* — Neugeboren O'Dowd PC

(57) ABSTRACT

A fabrication system comprises one of a substrate and work piece having at least one working surface, a tool coupled to a tool holder, at least one measurement system, and a control system. The at least one working surface comprises one or more regions. A first location of the tool, tool holder, and the one of a substrate and work piece are calibrated with reference to a coordinate system. The tool is adapted to affect creation of a device within the one or more regions. The at least one measurement system is adapted to obtain location information of at least a portion of at least one of the tool, tool holder, and one of a substrate and a work piece. The control system is adapted to receive the location information, determine a second location, and provide one or more output signals to one or more adjustment devices.

10 Claims, 31 Drawing Sheets

(56) References Cited

U.S. PATENT DOCUMENTS

| | | | |
|---|---|---|---|
| 7,591,557 B2 | 9/2009 | Plummer | |
| 7,639,369 B2* | 12/2009 | Owner-Petersen et al. | 356/512 |
| 7,769,419 B2* | 8/2010 | Daly | 600/318 |
| 7,926,942 B2 | 4/2011 | Plummer | |
| 7,959,286 B2 | 6/2011 | Plummer | |
| 8,158,917 B2* | 4/2012 | Li et al. | 250/201.9 |
| 8,274,031 B2* | 9/2012 | Nakai | 250/208.1 |
| 8,451,452 B2* | 5/2013 | Podoleanu et al. | 356/479 |
| 8,670,171 B2* | 3/2014 | Martin et al. | 359/224.1 |
| 8,749,657 B2* | 6/2014 | Iwane | 348/222.1 |
| 8,822,894 B2* | 9/2014 | Zheng et al. | 250/201.9 |
| 2003/0193647 A1* | 10/2003 | Neal et al. | 351/221 |
| 2005/0007603 A1* | 1/2005 | Arieli et al. | 356/601 |
| 2005/0249487 A1 | 11/2005 | Gutierrez | |
| 2006/0160250 A1 | 7/2006 | Bonassar et al. | |
| 2007/0122049 A1 | 5/2007 | Dowski, Jr. et al. | |
| 2007/0194207 A1* | 8/2007 | Wirth | 250/201.9 |
| 2007/0247638 A1* | 10/2007 | Owner-Petersen et al. | 356/511 |
| 2009/0034088 A1 | 2/2009 | Delaney et al. | |
| 2010/0045934 A1* | 2/2010 | Neal et al. | 351/211 |
| 2010/0165134 A1 | 7/2010 | Dowski, Jr. et al. | |
| 2010/0177277 A1 | 7/2010 | Kokonaski et al. | |
| 2010/0302159 A1* | 12/2010 | Findlay et al. | 345/166 |
| 2012/0092543 A1* | 4/2012 | Afshari et al. | 348/335 |

OTHER PUBLICATIONS

Chen, F., et al., "Overview of Three-Dimesional Shape Measurement using Optical Methods", "Optical Engineering", Jan. 2000, pp. 10-22, vol. 39, No. 1, Publisher: Soc'y of Photo-Optical Instrumentation Engineers, Published in: US.

Donaldson, R.R., et al., "Design and Construction of a Large, Vertical Axis Diamond Turning Machine", "Proc. of the SPIE", 1983, pp. 62-67, vol. 433, Publisher: Int'l Soc'y for Optical Engineering, Published in: US.

Gill, D.D., et al., "Design and Manufacturing of Complex Optics: The Dragonfly Eye Optic", "Sandia Report", Jan. 2007, pp. 1-32, Publisher: Sandia Nat'l Laboratories, Published in: US.

Goodman, J.W., "Introduction to Fourier Optics", "Webpage downloaded from Amazon.com Dec. 13, 2011", 1968, Publisher: McGraw-Hill Book Co., New York, N.Y., Published in: US.

Krishnan, G., et al., "Towards a True Spherical Camera", "Human Vision and Electronic Imaging XIV", 2009, p. 1-13, vol. 7240, No. 724002, Publisher: Proc. of SPIE-IS&T Electronic Imaging Keynote Address, Published in: US.

Kurtz, R., et al., "Improving the Accuracy of Surface Metrology", "Optical Engineering", Jul. 2011, pp. 1-6, vol. 50, No. 7, Publisher: Soc'y of Photo-Optical Instrumentation Engineers, Published in: US.

Leroux, C., et al., "Estimation of Centroid Positions with a Matched-Filter Algorithm: Relevance for Aberromertry of the Eye", "Optics Express", Jan. 18, 2010, pp. 1197-1206, vol. 18, No. 2, Publisher: Optical Soc'y of Am., Published in: US.

Levin, A., et al., "Understanding Camera Trade-Offs through a Bayesian Analysis of Light Filed Projections", "Computer Sci. and Artificial Intelligence Laboratory Technical Rep.", Apr. 16, 2008, Publisher: Presented at European Conference on Computer Vision (ECCV) Oct. 2008, Published in: US.

McCall, B., et al., "Fabrication of Plastic Microlens Arrays for Array Microscopy by Diamond Milling Techniques", "Micromachining and Miocrofabrication Process Technology XV—Proc. of SPIE", 2010, pp. 1-10, vol. 7590, No. 75900A, PublisherA, Publisher: Soc'y of Photo-Optical Instrumentation Engineers, Published in: US.

Min, Z., et al., "Coordinate Measurement Method Based on Coding Target", "Sixth Int'l Symp. on Precision Engineering Measurement and Instrumentation", 2010, vol. 7544, No. 754412, Publisher: Proc. of SPIE, Published in: US.

Moyan, S., et al., "Development of a Metrology Frame to Improve the Positioning Accuracy of Micro/Meso-Scale Machine Tools", "Int. J. Mechatronics and Manufacturing Systems", 2009, pp. 600-619, vol. 2, No. 5/6, Publisher: Inderscience Enterprises Ltd., Publisher in: US.

Murata, J., "Pico-Precision Displacement Sensor Using Digital Image Analysis", "Nuclear Sci. Symp. Conf. Rec.", 2005, pp. 675-679, Publisher: IEEE, Publisher in: US.

Neal, David R., et al., "Shack-Hartmann Wavefront Sensor Precision and Accuracy", "Advanced Characterization Tech. for Optical, Semiconductor, and Data Storage Components", 2002, pp. 148-160, vol. 4779, Publisher: Proc. of SPIE.

Scheiding, S., et al., "Freedrom Manufacturing of a Microoptical Lens Array on a Steep Curved Substrate by use of a Voice Coil Fast Tool Servo", "Optics Express—Presented at Proc. of Structured and Freeform Surfaces 2001 Spring Topical Meeting", Nov. 21, 2011, pp. 23938-23951, vol. 19, No. 24, Publisher: Optical Soc'y of Am., Published in: US.

Topa, D.M., et al., "Optimized Method for Focal Spot Location using Center of Mass Algorithms", "Proc. of SPIE", 2002, pp. 1-14, vol. 4769, No. 14, Publisher: Int'l Soc'y for Optical Engineering, Published in: US.

Vyas, A., et al., "Optimization of Existing Centroiding Algorithms for Shack Hartmann Sensor", "Proc. of the Nat'l Conf. on Innovative Computational Intelligence & Security System", Apr. 4, 2009, pp. 400-405, Published in: US.

Yin, X. et al., "Automatic Detection for Shack-Hartmann Wavefront Senor", "Int'l Conf. on Innovative Computational Intelligence & Security System", Jul. 17, 2009, pp. 1986-1991, Publisher: IEEE/ASME, Published in: SG.

Young, Lee W., "International Search Report and Written Opinion re Application No. PCT/US11/51751", Feb. 13, 2012, p. 11 Published in: US.

\* cited by examiner

IMAGING, FABRICATION AND MEASUREMENT SYSTEMS AND METHODS

PRIORITY AND CROSS REFERENCE TO RELATED APPLICATIONS

This application is based upon, and claims priority to Provisional U.S. Application No. 61/403,396, entitled Systems and Methods for Event Capture, Processing, and Distribution, filed on Sep. 15, 2010. The entirety of Provisional U.S. Application No. 61/403,396, including all exhibits and appendices are incorporated herein by reference. This application is further based upon, and claims priority to Provisional U.S. Application No. 61/571,205, entitled Systems and Methods for Precision, filed on Jun. 22, 2011. The entirety of Provisional U.S. Application No. 61/571,205, including all exhibits and appendices are incorporated herein by reference. This application is yet further based upon, and claims priority to Provisional U.S. Application No. 61/574,776, entitled Systems and Methods for Low Cost, filed on Aug. 9, 2011. The entirety of Provisional U.S. Application No. 61/574,776, including all exhibits and appendices are incorporated herein by reference. This application is yet still further based upon, and claims priority to Provisional U.S. Application No. 61/574,910, entitled Systems and Methods for Coding, filed on Aug. 11, 2011. The entirety of Provisional U.S. Application No. 61/574,910, including all exhibits and appendices are incorporated herein by reference.

FIELD OF THE INVENTION

Aspects of the present invention relate to imaging, fabrication, and measurement processes and techniques. In particular, but not by way of limitation, the present invention relates to providing cost advantages with increased yield and tighter tolerances in optics fabrication.

BACKGROUND OF THE INVENTION

Electronics are fabricated using nanometer precision fabrication techniques and enjoy the benefit of Moore's law with continually reduced cost per level of performance, or increased performance at constant cost. Optics are currently not fabricated using nanometer precision fabrication techniques over a large scale or volume and so do not enjoy benefit of a cost/performance ratio that improves steadily over time.

SUMMARY OF THE INVENTION

Illustrative embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

One embodiment of the invention comprises a fabrication system comprising one of a substrate and a work piece, a tool coupled to a tool holder, one measurement system, and a control system. The one of a substrate and work piece may comprise at least one working surface, wherein, the at least one working surface may comprise one or more regions. The tool may be adapted to affect creation of a device within the one or more regions. A first location of the tool, tool holder, and the one of a substrate and work piece may be calibrated with reference to a co-ordinate system. The at least one measurement system is adapted to obtain location information of at least a portion of at least one of the tool, tool holder, and one of a substrate and a work piece. The control system is adapted to receive the location information, determine a second location with reference to the co-ordinate system, and provide one or more output signals to one or more adjustment devices adapted to adjust a position of the one of a substrate and work piece, tool, and tool holder.

Another embodiment of the invention comprises a fabrication system comprising one of a substrate and work piece, tool coupled to a tool holder, at least one illumination system, one or more adjustment devices, and a control system. A first location of the tool, tool holder, and the one of a substrate and work piece are calibrated with reference to a co-ordinate system. The one of a substrate and work piece comprise at least one working surface with the at least one working surface comprising one or more regions and one or more reference marks. The tool is adapted to affect creation of a device within the one or more regions. The at least one illumination system is adapted to emit at least one wavelength of light, with at least a portion of the one or more reference marks at least one of reflecting and adsorbing the at least one wavelength of light. The at least one measurement system is adapted to obtain location information of at least a portion of at least one of the tool, tool holder, and one of a substrate and a work piece, while the one or more adjustment devices are adapted to adjust a position of the one of a substrate and work piece, tool, and tool holder. The control system, meanwhile, is adapted to receive the location information, determine a second location of at least one of the tool, tool holder, and one of a substrate and a work piece, and provide one or more adjustment output signals to the one or more adjustment devices.

Yet another embodiment of the invention comprises a measurement system. One measurement system comprises a first plurality of imaging channels, and at least one second plurality of imaging channels. Each of the first plurality of imaging channels and at least one second plurality of imaging channels comprise optics, a micro lens array, and one or more electromagnetic energy detectors. Each of the optics comprises an exit pupil, while the optics in the first plurality of imaging channels are adapted to receive light comprising information about at least one first measured object, and the optics in each of the second plurality of imaging channels are adapted to receive light comprising information about at least one of the at least one first measured object and at least one second measured object. The micro lens array is adapted to receive at least a portion of the light from the exit pupil and emit focused light. The one or more electromagnetic energy detectors are adapted to receive the emitted focused light from the micro lens array.

And yet another embodiment of the invention comprises a measurement system comprising intensity coding optics, an electromagnetic energy detector, and a processing device. The intensity coding optics are adapted to provide information about one or more objects. The electromagnetic energy detector comprises a plurality of pixels and is adapted to receive the information about the one or more objects. Each of the plurality of pixels comprises a size larger than a spatial resolution of the intensity coding optics. The pixels are further adapted to output data. The processing device is adapted to receive the data and determine a location of the one or more objects.

And still yet another embodiment of the invention comprises a method of forming an electric lens comprising. One method comprise at least one of removing a first material from one of a substrate and a work piece, adding a second material to the one of a substrate and a work piece, and providing a third material coating at least one of the first material and second material. The method further comprise making a tool from at least one of the first material, second material, and third material. The method also comprises forming a first portion of a lens with the tool, adding electronics to the first portion of the lens, and forming a remaining portion of the lens to create an electric lens.

And one other embodiment of the invention comprises an imaging system. One imaging system comprises an optical element, one or more electromagnetic energy detectors, a field opening with a detector mounting region, a mounting element and an assembly. The optical element comprises optics and a non-planar surface comprising at least one of a front surface a back surface and one or more apertures. The one or more electromagnetic energy detectors are operatively coupled to the back surface, with each of the electromagnetic energy detectors being electronically coupled to a signal reception device. The field opening with a detector mounting region is also operatively coupled to the back surface, as is the mounting element. The mounting element is adapted to provide spacing between the optics, the one or more electromagnetic energy detectors, and the field opening with the detector mounting region. The assembly comprises one or more kinematic couplings adapted to maintain tolerances between the optical element, the one or more electromagnetic energy detectors, the mounting element, and the one or more apertures.

BRIEF DESCRIPTION ON THE DRAWINGS

Various objects and advantages and a more complete understanding of the present invention are apparent and more readily appreciated by reference to the following Detailed Description and to the appended claims when taken in conjunction with the accompanying Drawings, where like or similar elements are designated with identical reference numerals throughout FIGS. 1-31 and wherein:

Figure 16:
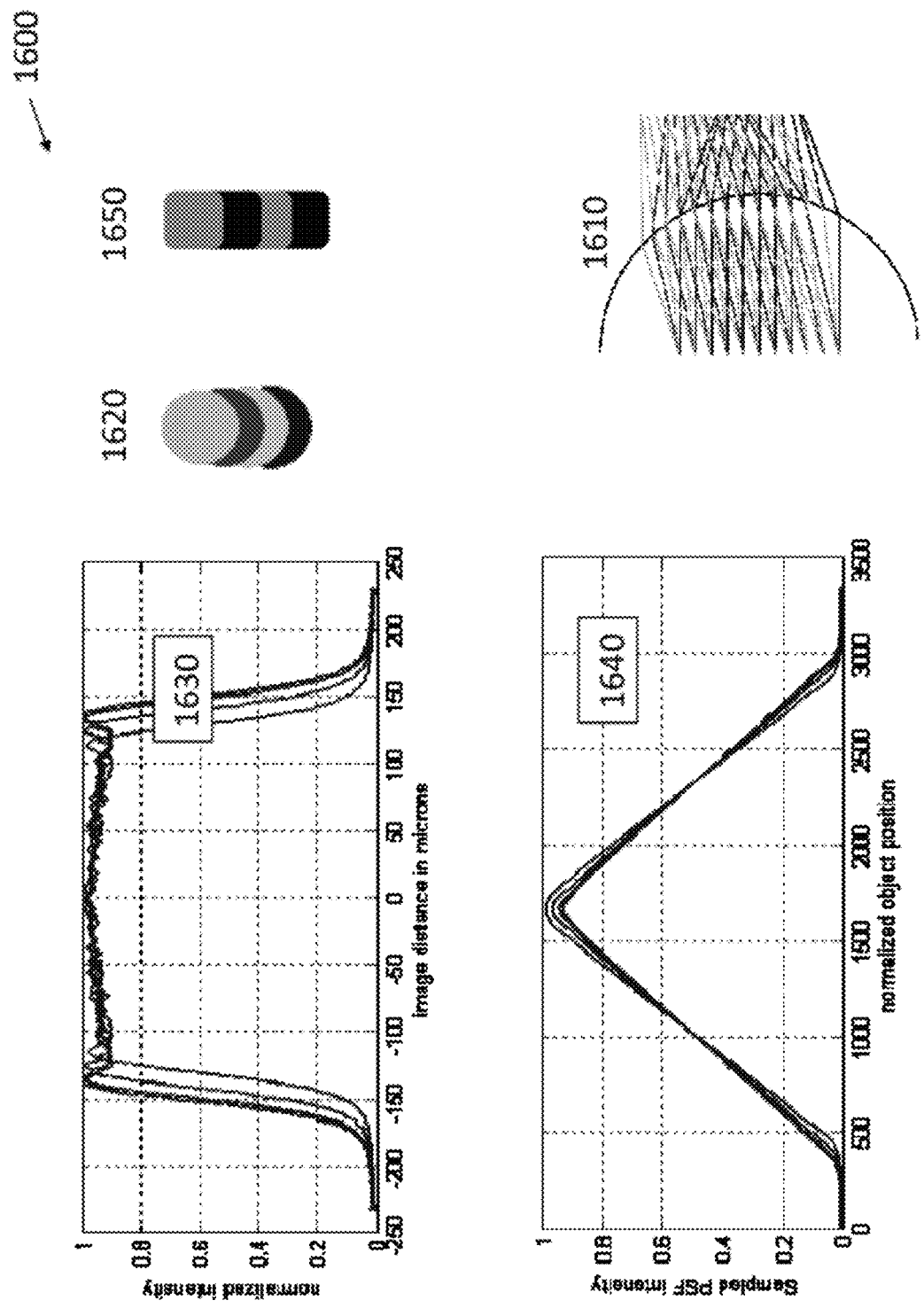
Figure 17:
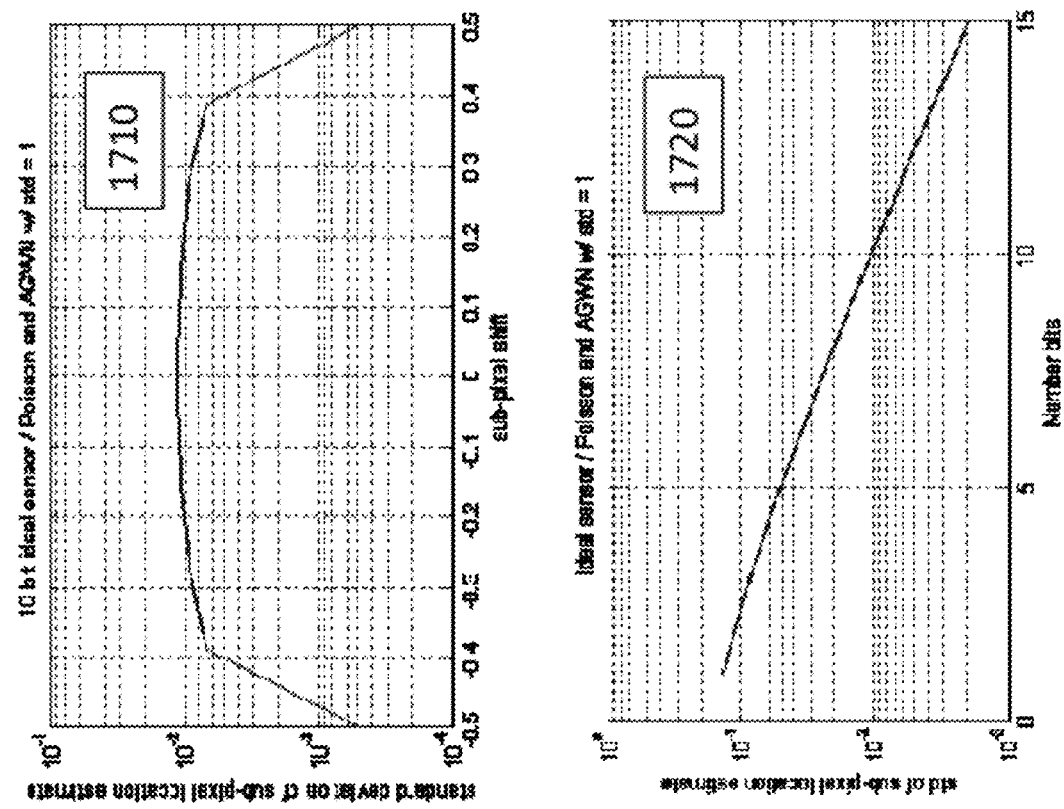
Figure 18:
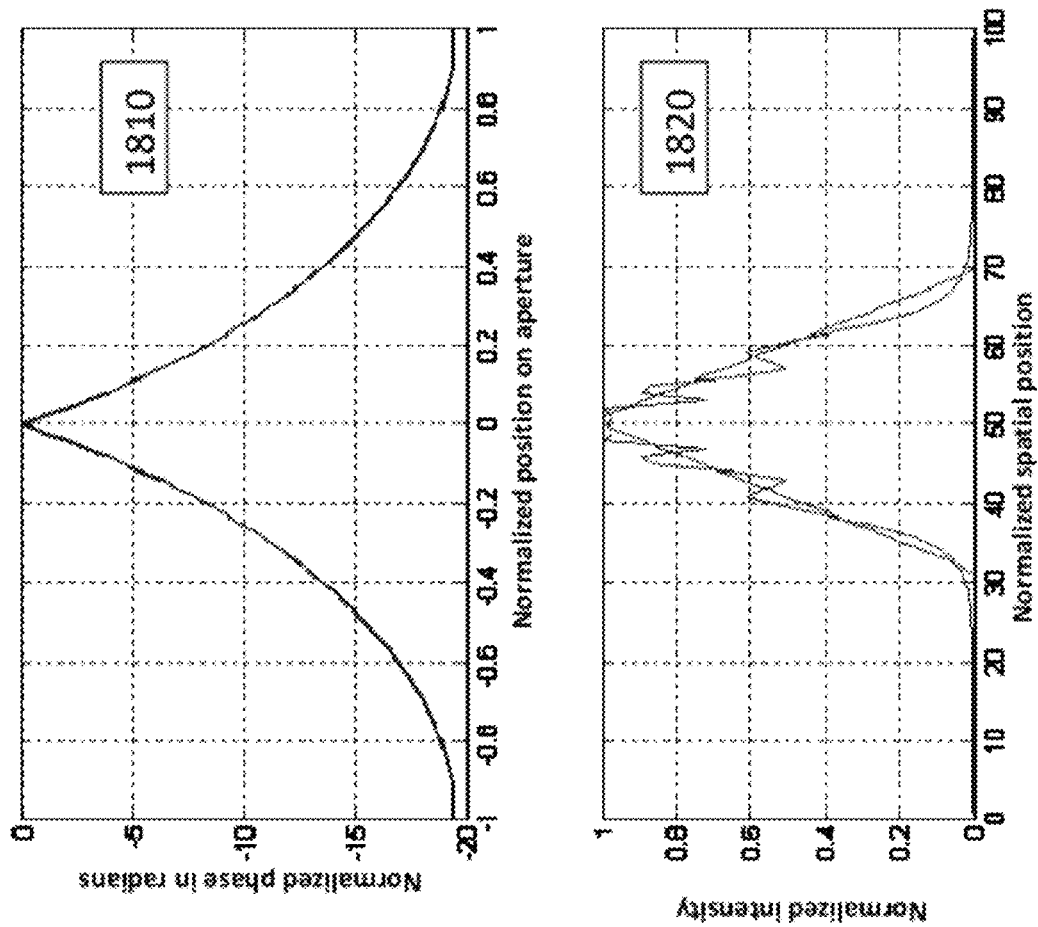
Figure 19:
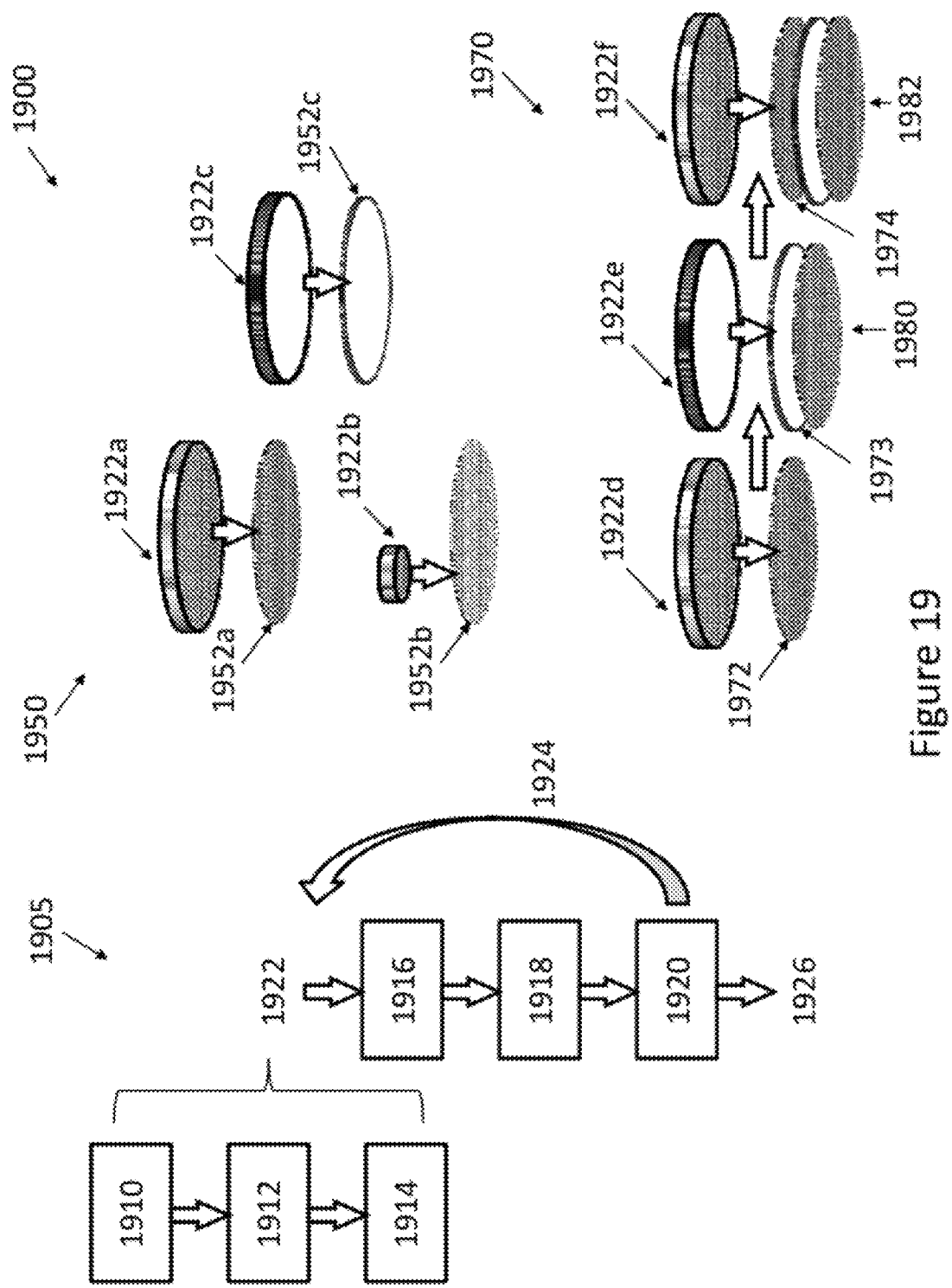
Figure 20:
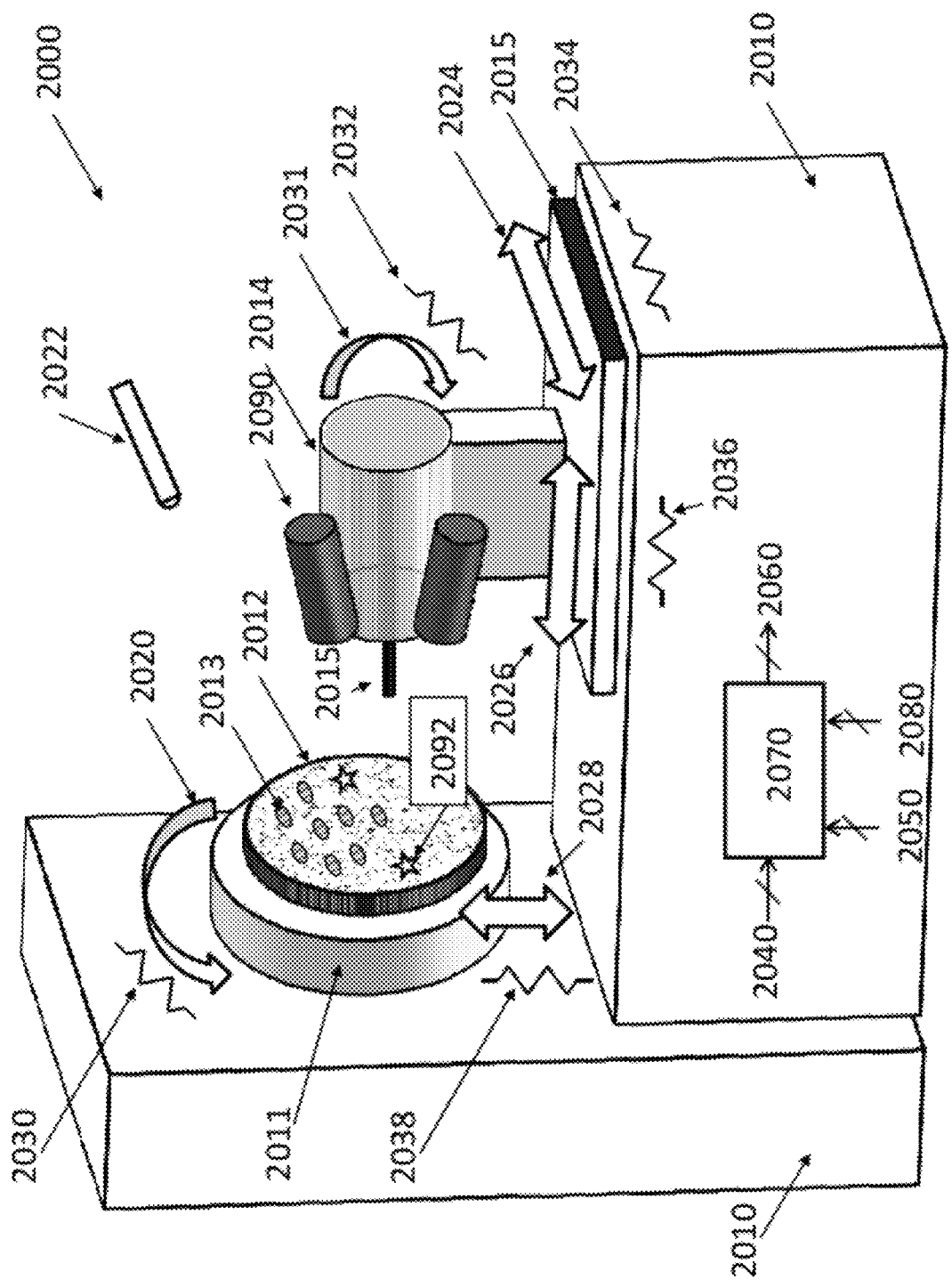
Figure 21:
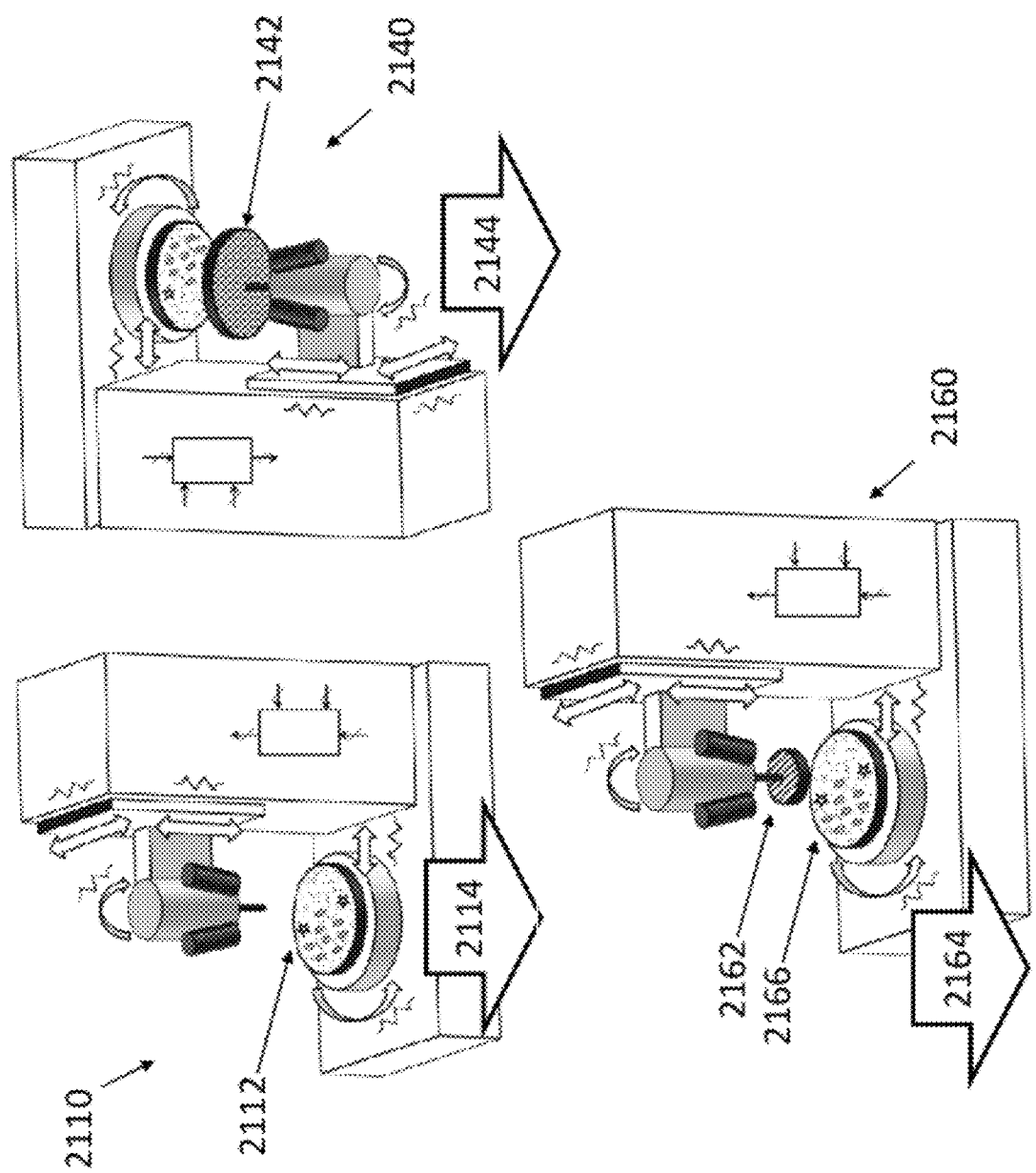
Figure 22:
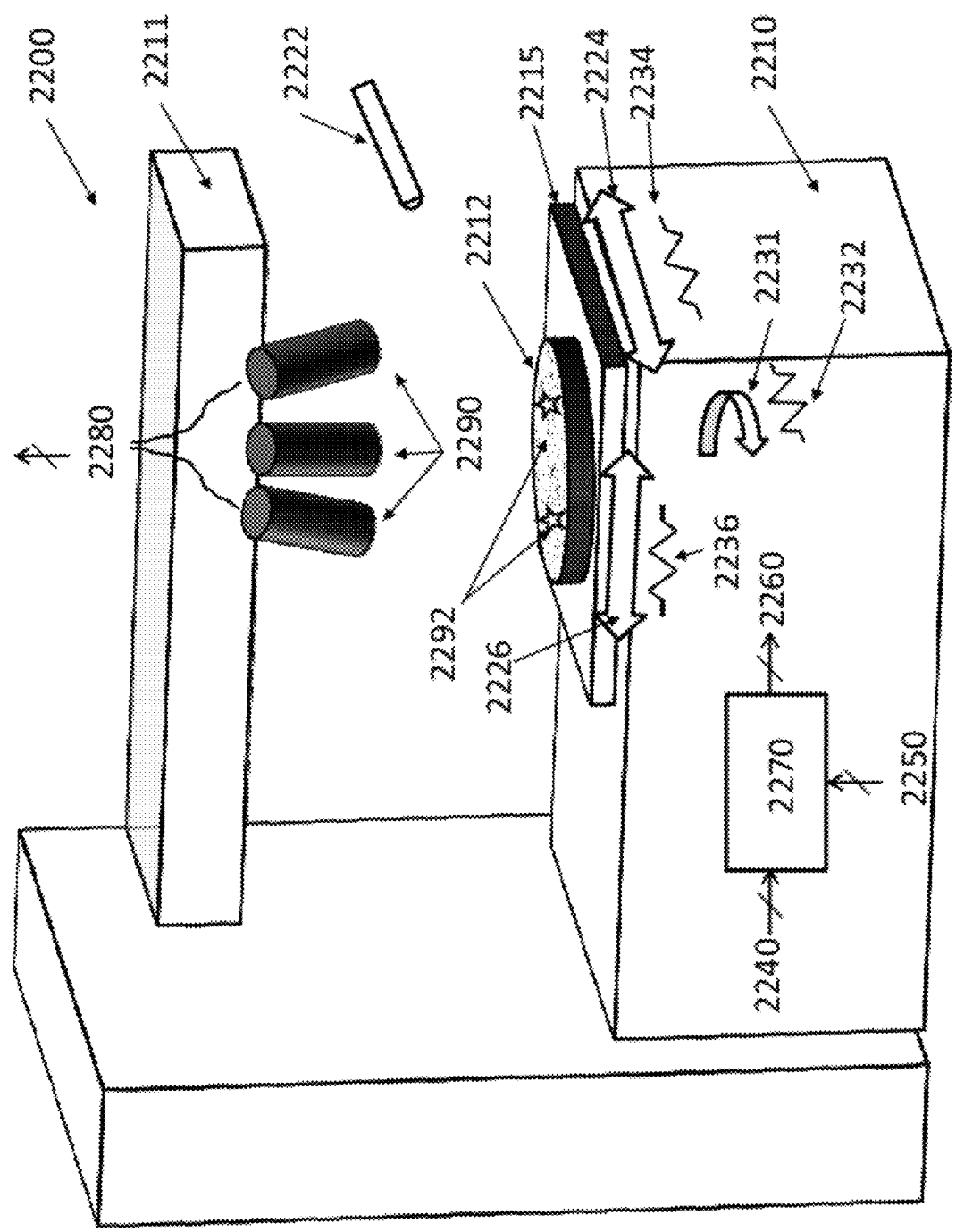
Figure 23:
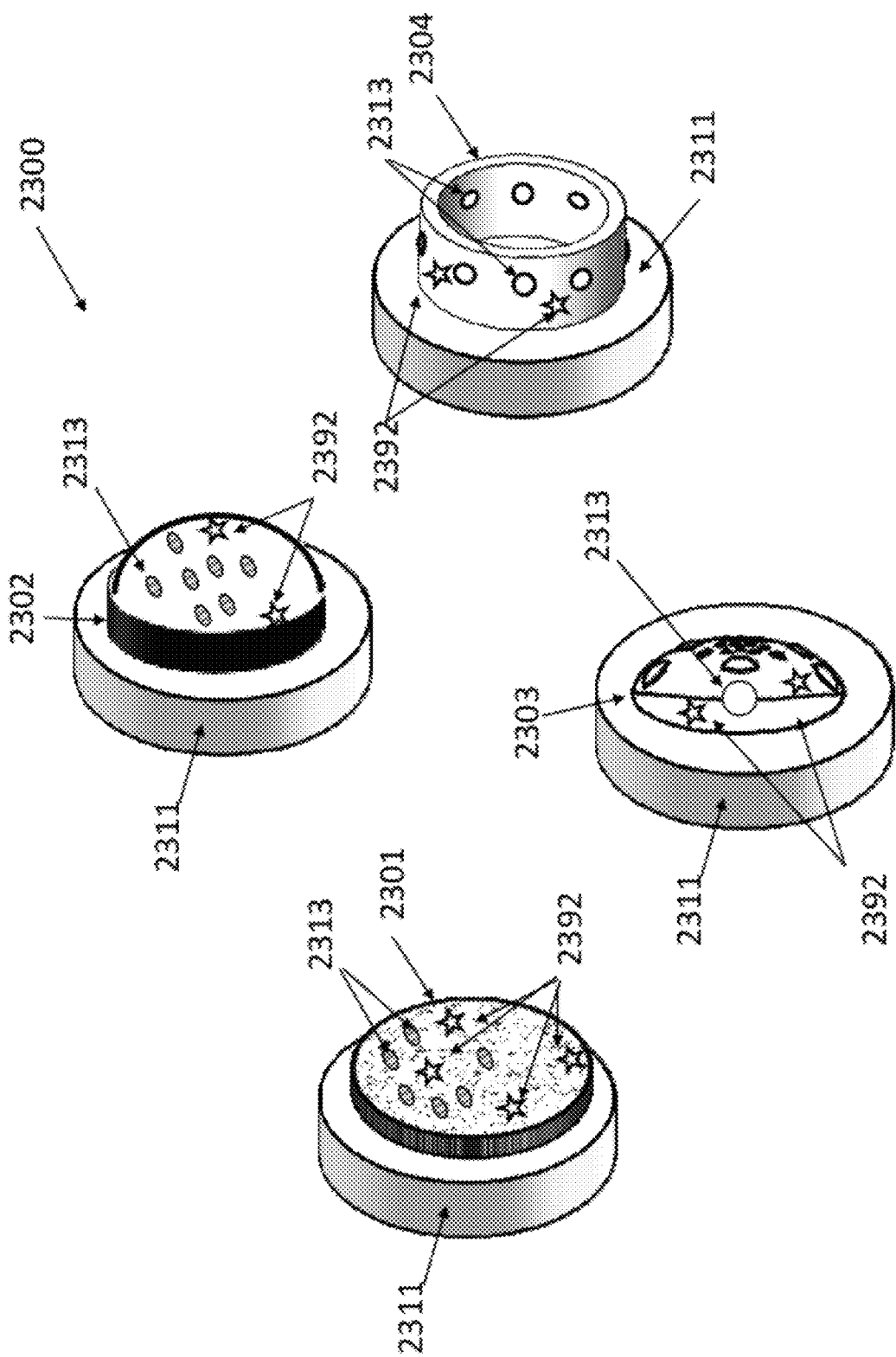
Figure 24:
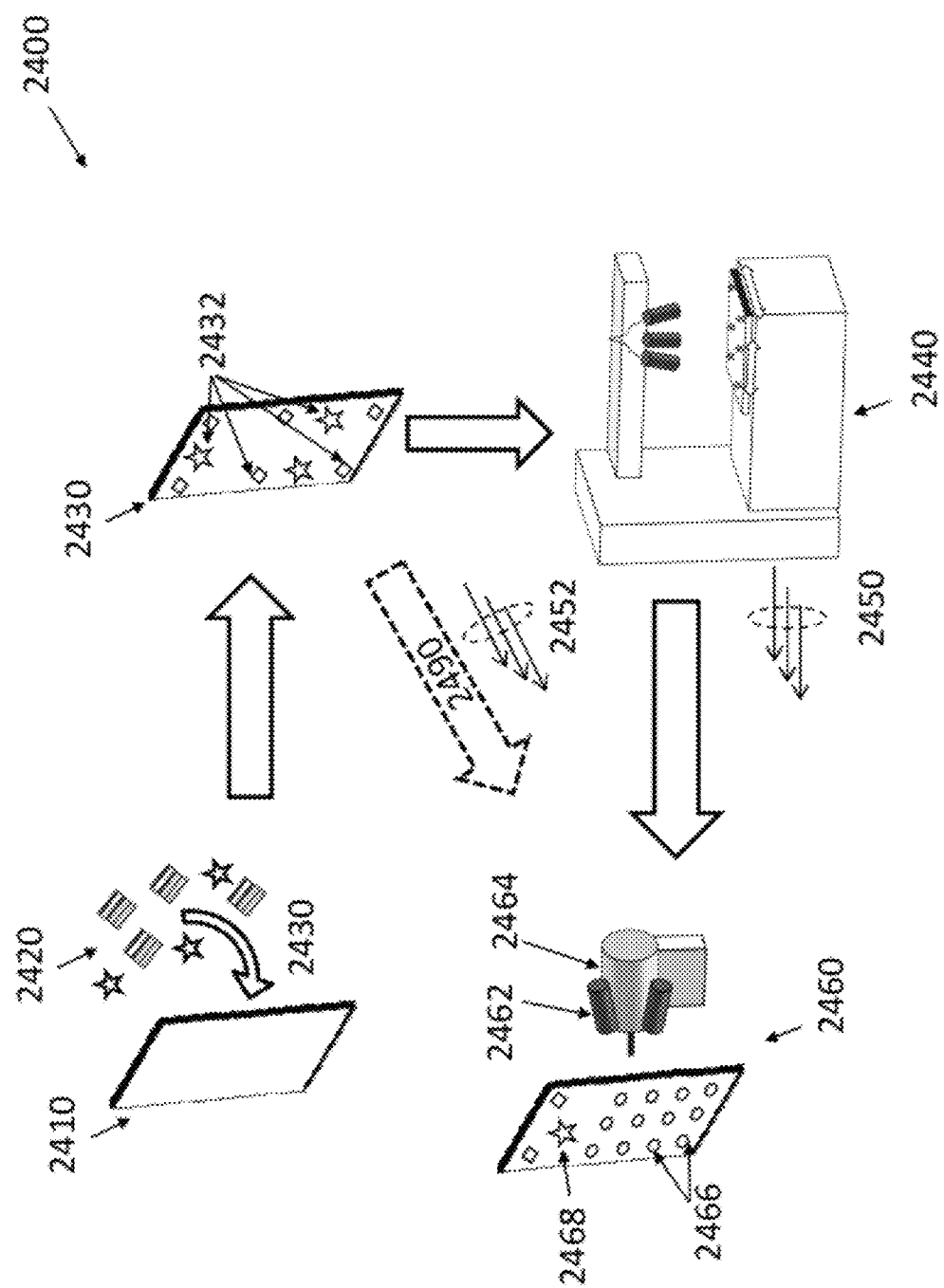
Figure 25:
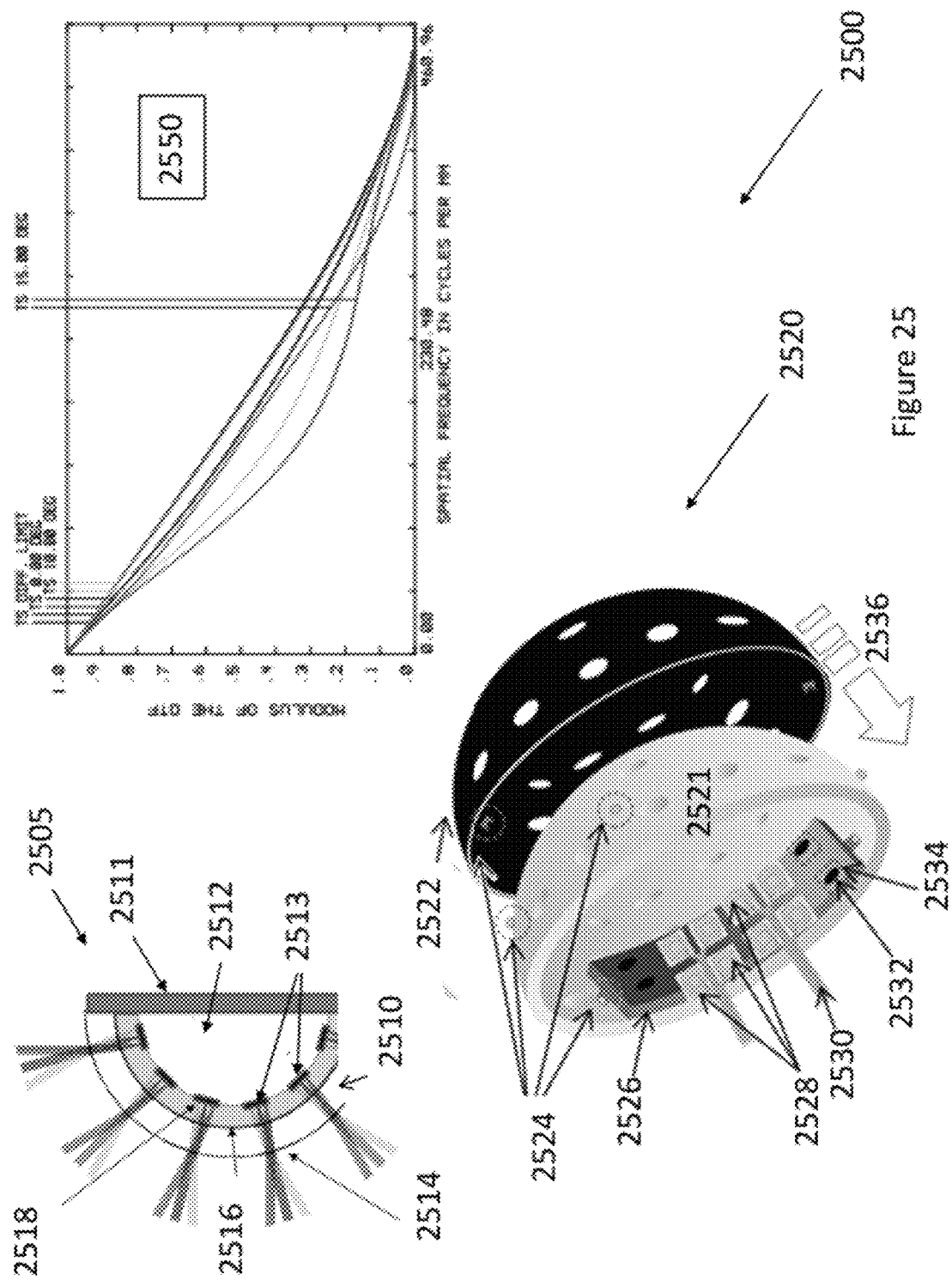
Figure 26:
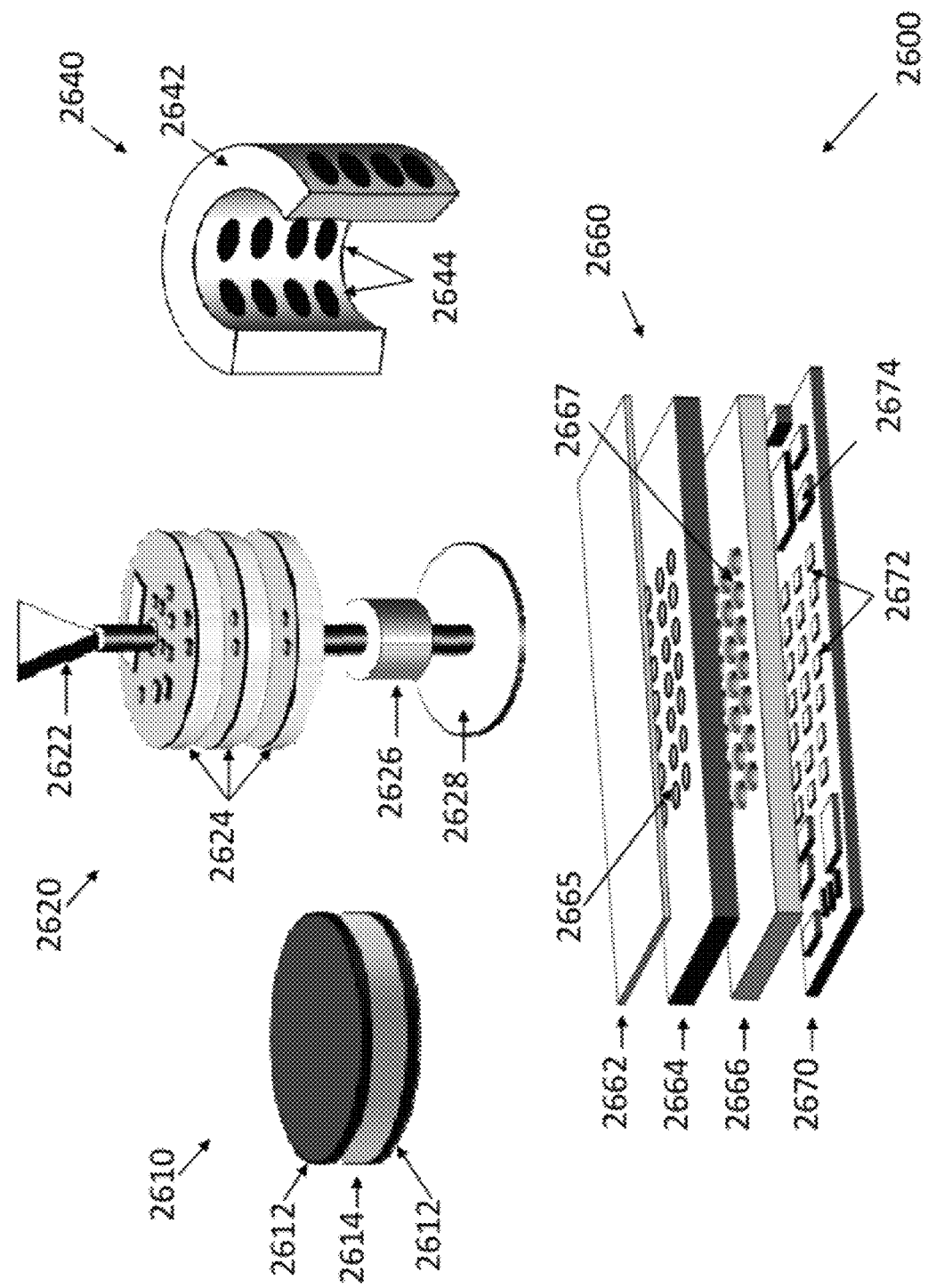
Figure 27:
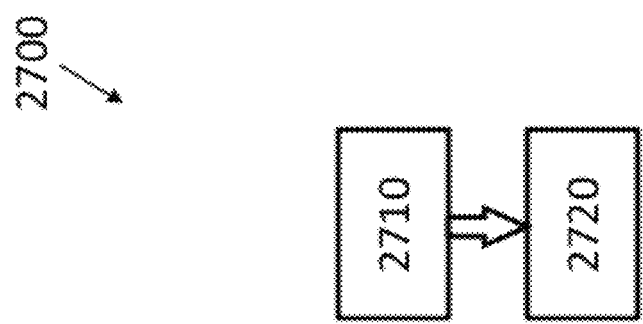
Figure 28:
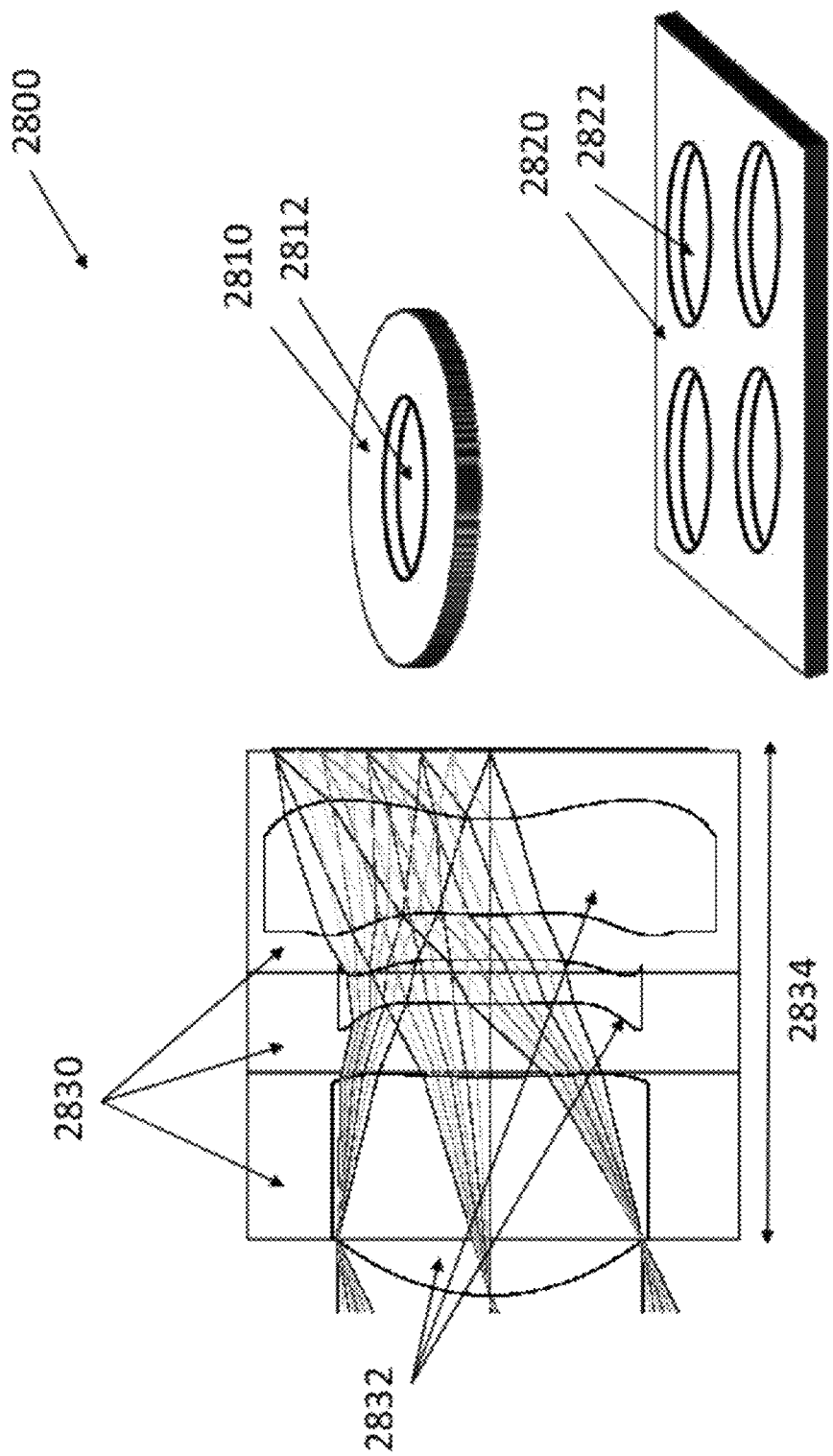
Figure 29:
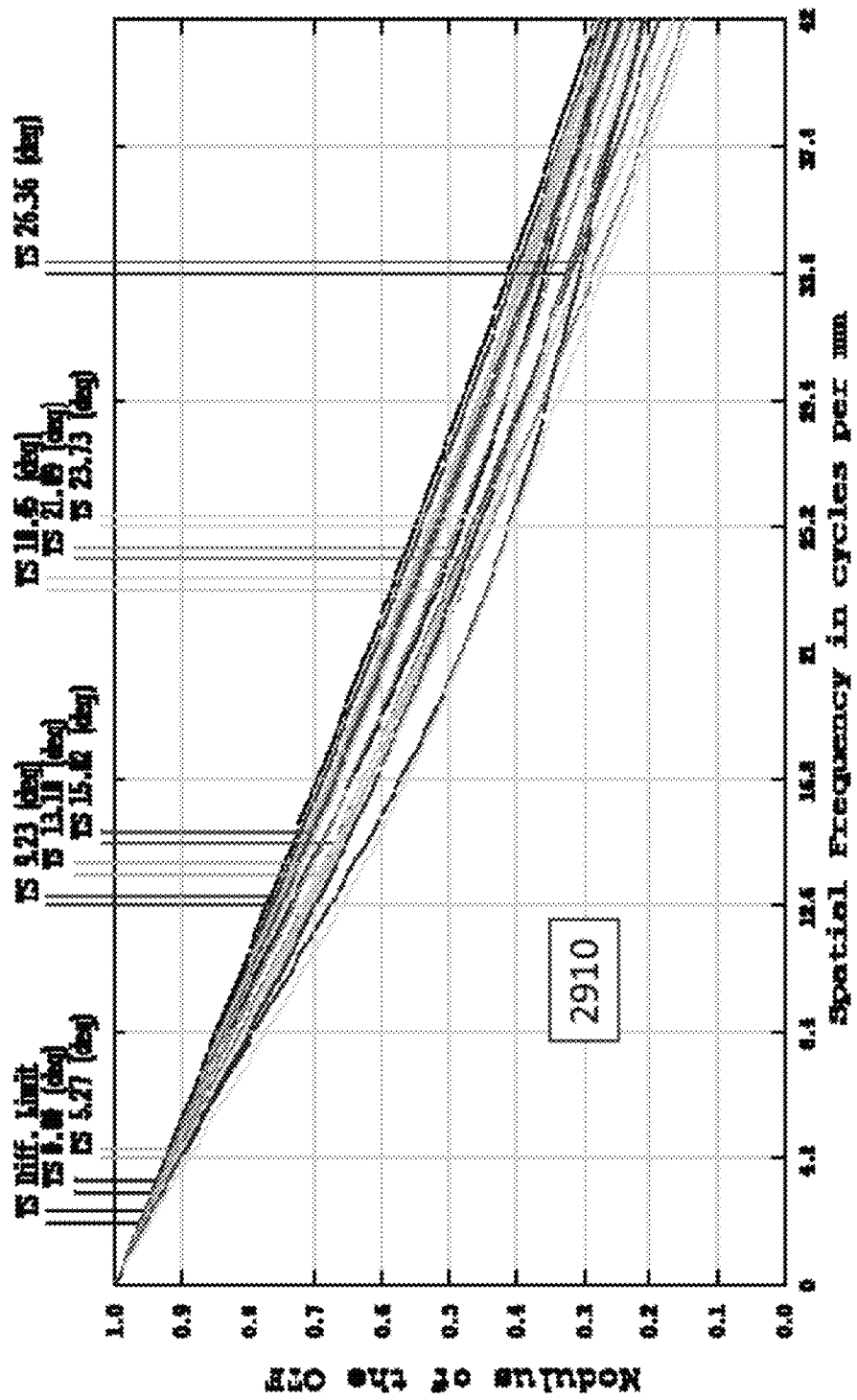
Figure 30:
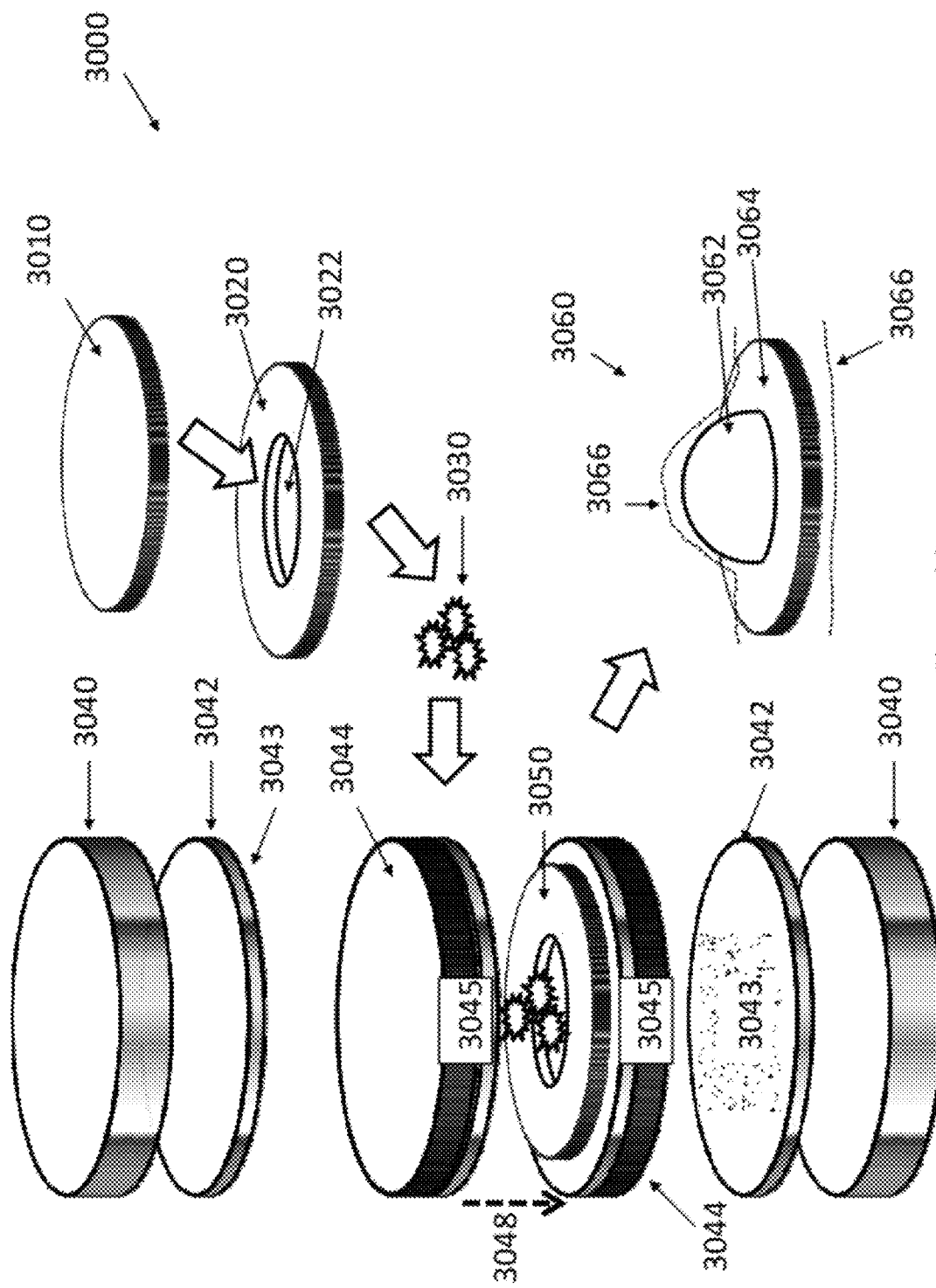
Figure 31:
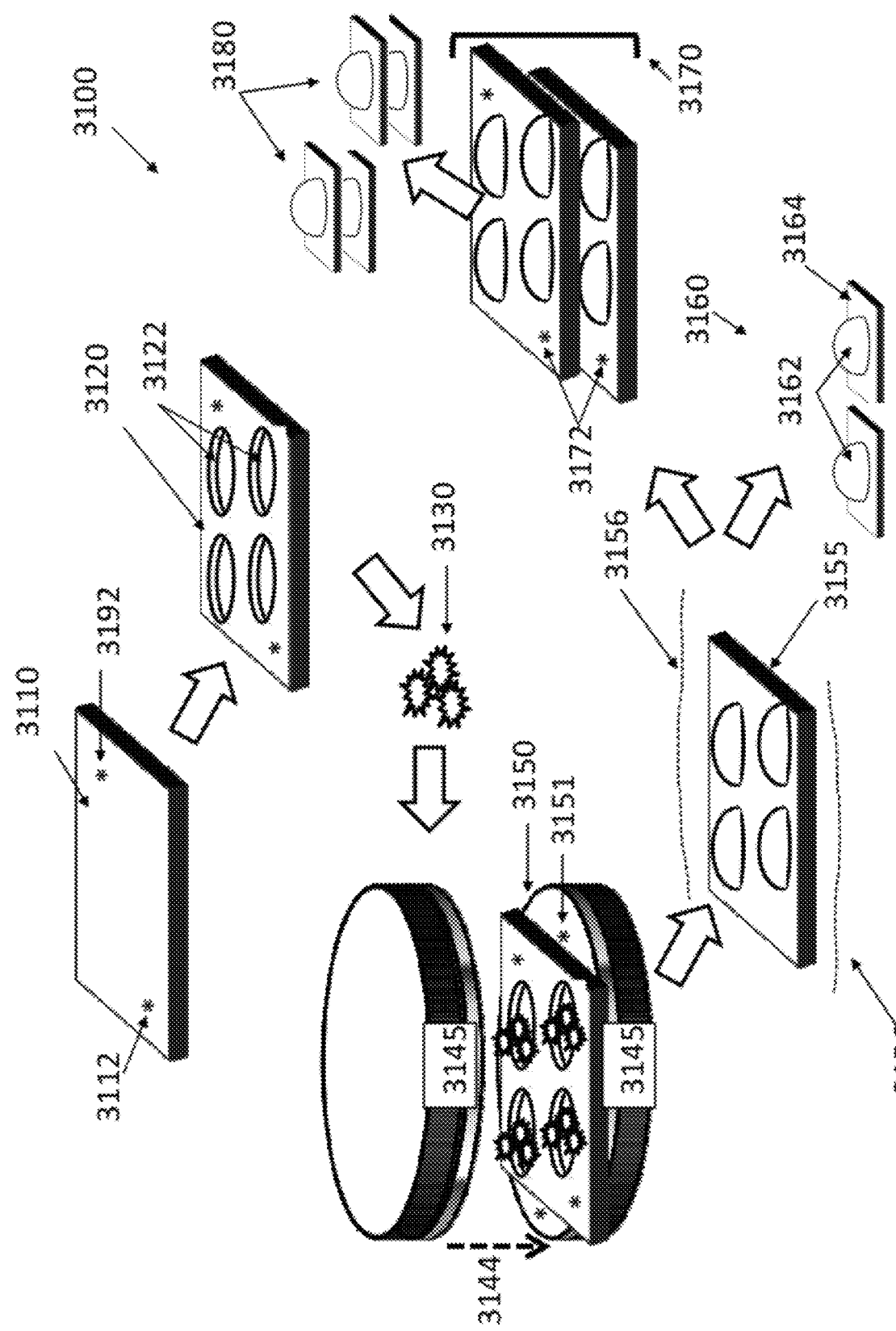

FIG. 16 displays a performance of electromagnetic detector sensors according to one embodiment of the invention;

FIG. 17 illustrates graphs displaying a performance of electromagnetic detector sensors according to one embodiment of the invention;

FIG. 18 illustrates graphs displaying an intensity coded optic phase and a performance of electromagnetic detector sensors according to one embodiment of the invention;

FIG. 19 illustrates processes that may be carried out in connection with the embodiments described herein;

FIG. 20 illustrates a manufacturing system according to one embodiment of the invention;

FIG. 21 illustrates various manufacturing systems according to one embodiment of the invention;

FIG. 22 illustrates a measurement system according to one embodiment of the invention;

FIG. 23 illustrates portions of a manufacturing system according to one embodiment of the invention;

FIG. 24 illustrates processes that may be carried out in connection with the embodiments described herein;

FIG. 25 illustrates an optic system according to one embodiment of the invention;

FIG. 26 illustrates optic systems according to one embodiment of the invention;

FIG. 27 illustrates processes that may be carried out in connection with the embodiments described herein;

FIG. 28 illustrates one or more portions of one or more of a manufacturing, measuring, and imaging system according to one embodiment of the invention;

FIG. 29 illustrates a graph displaying a performance of one or more systems described herein according to one embodiment of the invention;

FIG. 30 illustrates one or more portions of a lens and fabrication process according to one embodiment of the invention;

FIG. 31 illustrates one or more portions of lens arrays and fabrication process according to one embodiment of the invention.

DETAILED DESCRIPTION

Figure 1:
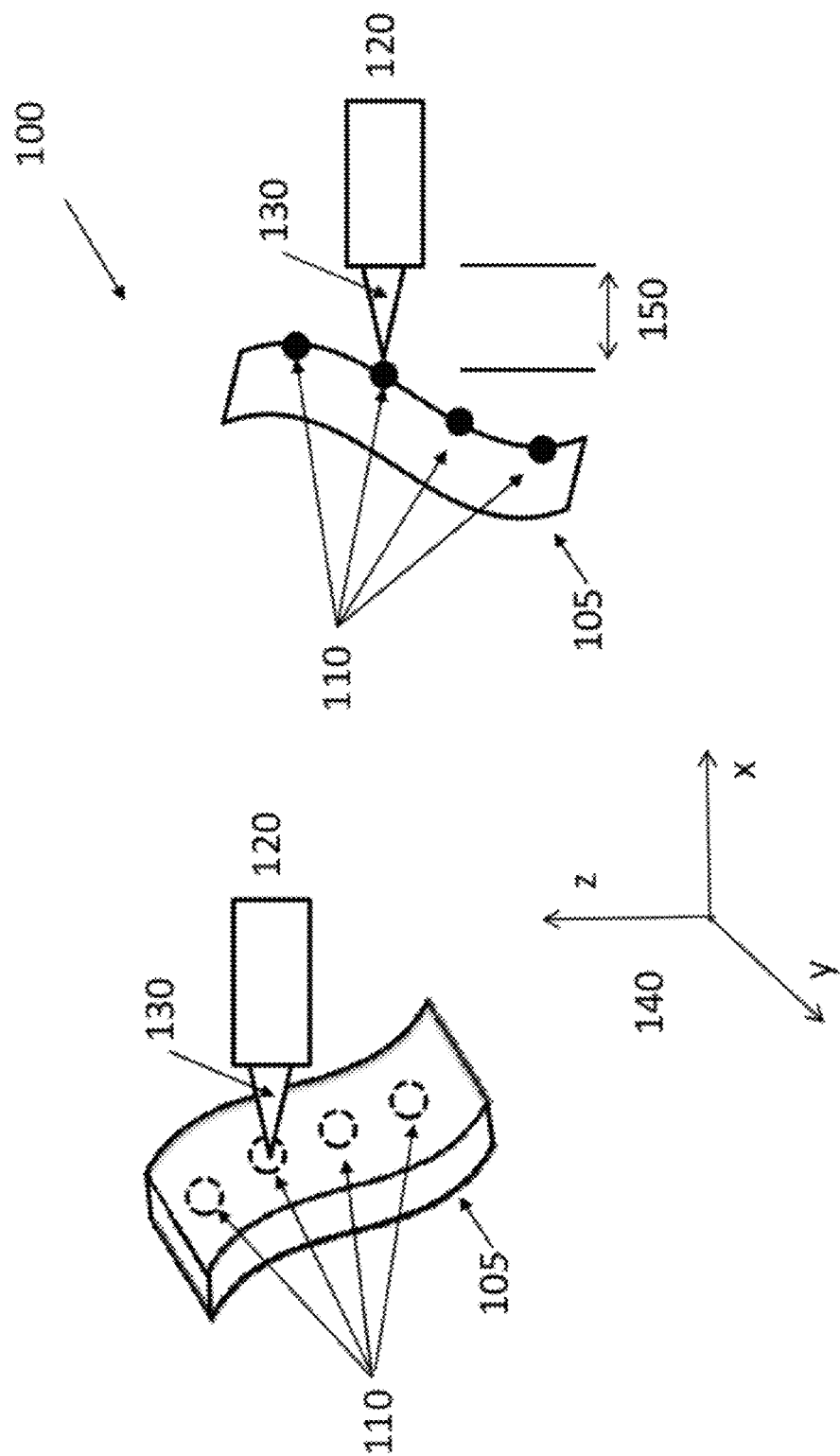
FIG. 1 illustrates a block diagram depicting a prior art open loop fabrication system.

Referring first to FIG. 1, shown is a prior art open loop fabrication system 100. Tool 130 is held by tool holder 120 and positioned to operate in regions 110 on work piece 105. Tool 130 and tool holder 120 and work piece 105 are positioned relative to coordinate system 140. Precision and accuracy of the locations of the regions 110 and precision and accuracy of a distance 150 depend on prior calibration and stability of the tool 130, tool holder 120, and work piece 105 with and between coordinate system 140. The precision of system 100 does not allow devices formed from regions 110 on work piece 105 to enjoy benefit of a cost/performance ratio that improves steadily over time.

Aspects of the present invention comprises precise manufacturing systems, portions and features of systems, and methods at a cost low enough to enjoy benefit of a cost/performance ratio that improves steadily over time.

Figure 2:
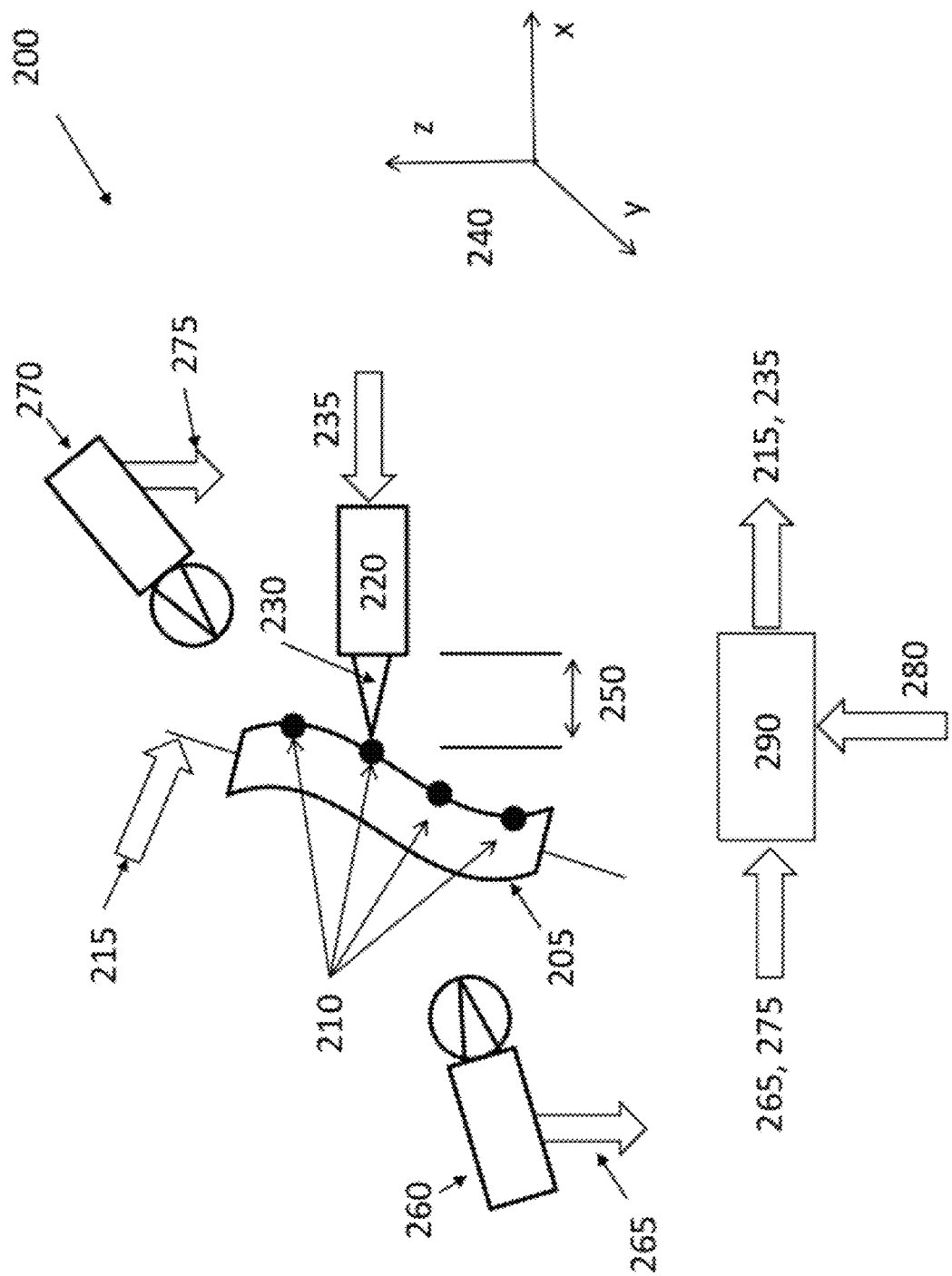
FIG. 2 illustrates a block diagram depicting a fabrication system according to one embodiment of the invention.

FIG. 2 is an embodiment of the invention shown as system 200. Tool 230 may be coupled to tool holder 220 and positioned to operate in one or more regions 210 on work piece 205. Regions 210 may be located within, or on, a working surface of the work piece 205. Tool 230 and tool holder 220 and work piece 205 may be positioned in a first location relative to coordinate system 240. Precision and accuracy of the locations of the regions 210 and precision and accuracy of the distance 250 depend on prior calibration and stability of tool 230, tool holder 220, and work piece 205 with and between coordinate system 240 operating in cooperation with measurement system 260 and 270 and control system 290. Distance 250 comprises a distance between one or more regions 210 being worked on by tool 230 and the tool 230. Measurement system 260 and 270 provide measurements 265 and 275 respectively. Measurements 265 and 275 may comprise location information of at least a portion of at least one of the tool 230, tool holder 220, and work piece 205, and may be combined with input 280 by control system 290 to form error-corrected output signals 215 and 235. Input 280 may, for example, be one or more ideal locations of the work piece 205 relative to the tool 230. The control system may use the location information in measurements 265, 275 to determine a second location of at least a portion of at least one of the tool 230, tool holder 220, and work piece 205, and/or adjust a signal level of the output signals 215, 235. Output signal 215 may be sent to one or more adjustment devices which influences the relative and absolute position of work piece 205 and output signal 235 influences the relative and absolute position of tool holder 220 and tool 230, based on the first location, second location, and one or more ideal locations. The distance 250 and locations of regions 210 formed on the work piece and the precision of the spacing and locations are thus dictated by the relative positions of work piece 205 and tool 230 instead of prior calibration of absolute positions. The precision of system 200 allows devices formed from regions 210 on work piece 205 to enjoy benefit of a cost/performance ratio that improves steadily over time. For example, in one embodiment, the work piece 205 may comprise a disk of metal, plastic, ceramic, or semiconductor material, while a device formed from region 210 may comprise an optical element, a flow control feature, a nano-structure device, and/or an electro-optical element. System 200 allows devices formed in regions 210 on work piece 205 to enjoy the benefit of cost/performance that improves over time by monitoring a position and of the work piece 205 working surface and overall form during processing/creation of the device.

In one embodiment, measurement systems 260 and 270 may comprise wavefront sensors adapted to accurately measure a phase and/or an amplitude of wavefronts, which may also be referred to as objects throughout the specification. In such an embodiment, both phase and intensity information may be electronically recorded in a memory device. In one embodiment, control system 290 may comprise the memory device. One type of measurement systems 260, 270 may comprise a generalized Shack-Hartmann implementation where phase and amplitude of specialized non-point objects may be coded and measured. Variations of generalized Shack-Hartmann measurement systems are also contemplated and may include configurations that code phase and amplitude as a function of exit pupil angle, or light field recording.

One technical difficulty of accurately forming regions 210 on work piece 205 is related to the physical separation of regions 210 and the desired precision with which each region should be formed. For example, in one embodiment, each region 210 may be physically distinct from every other region 210 on the work piece 205. In such an embodiment, each region 210 may be located a distance of, for example, 10 nm, from every other region. As further explained in the specification, it is this distance between regions 210 that may at least partially determine the precision of devices formed in each region 210. Therefore, the larger the separation between regions 210 and the higher the requirement for precision within each region 210, the larger the degree of difficulty. The precision of system 200 with measurement systems 260 and 270 may be maximized by implementing a large field of view for measurement systems 260, 270, which may be accomplished through configurations involving multi-aperture measurement systems 260, 270 comprising micro-optics on curved substrates or work pieces 205. In one embodiment, a substrate may comprise the work piece 205. For example one or more materials may be used to help create a device in a region 210. Upon creation of the device, the one or more materials may comprise a substrate which may be used similar to the work piece 205 as described herein. It is contemplated, that throughout the specification, the terms "substrate" and "work piece" 205 may be used interchangeably, where appropriate. Other configurations may be comprised of multi-aperture measurement systems 260, 270 with planar substrates. Still other configurations may be comprised of collections of single aperture measurement systems 260, 270. Measurements 265 and 275 may provide remote metrology feedback of the location of work piece 205 to the control system 290.

Control system 290 is configured to accept measurements 265 and 275. In cooperation with control system 290, measurements 265 and 275 provide metrology feedback and closed loop control. Measurements 265 and 275 are further configured to provide non-contact 6 dimensional metrology feedback to control system 290. In another embodiment, measurements 265 and 275 are further configured to provide in-situ non-contact 6 dimensional metrology. In another embodiment measurement systems 260 and 270 cooperate with control system 290 and are configured to provide multi-system spatially coherent closed loop control. In another embodiment measurement systems 260 and 270 are jointly designed with control system 290 and are configured to provide multi-system spatially coherent closed loop control. Control system 290 receives measurements 265 and 275 substantially continuously as the relative position of work piece 205 changes with respect to the tool 230. The control system 290 may also receive measurements 265, 275 when the tool 230 is operating within one or more regions 210, as the relative locations of work piece 205 and tool 230 vary.

Figure 3:
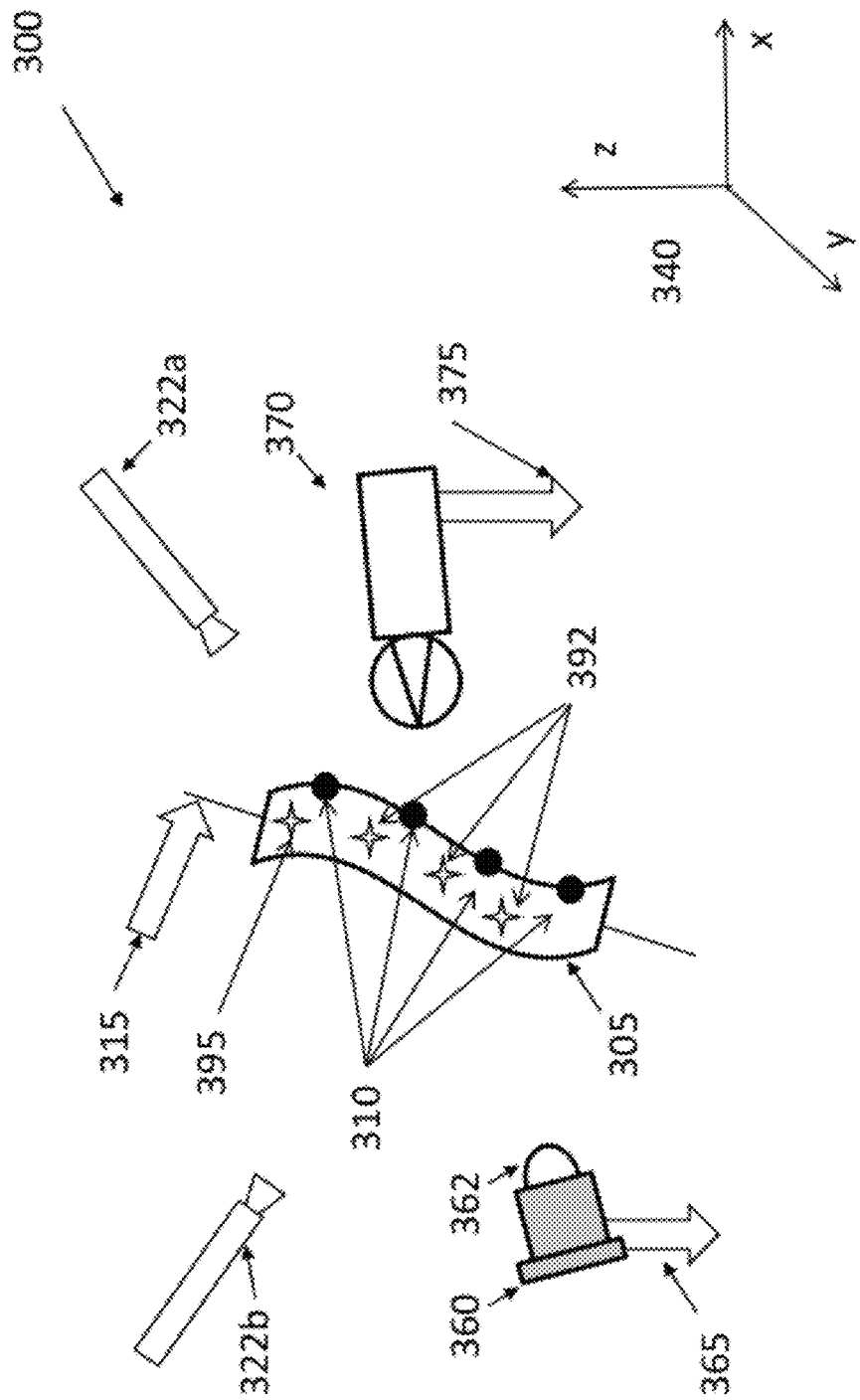
FIG. 3 illustrates a block diagram depicting a measurement system according to one embodiment of the invention.

FIG. 3 is an embodiment of the invention shown as system 300. Measurement system 360 and 370 provide measurements 365 and 375 respectively. Measurements 365 and 375 are referenced to coordinate system 340 and provide location information about the regions 310 and reference marks 392 and 395. Reference marks 392 and 395 cooperate with measurement system 370 and 360 and illumination systems 322a and 322b to form measurements 365 and 375, and may be located on the same working surface of the work piece 305 as the regions 310. Measurement system 360 is equipped with specialized optics 362 to improve the measurement precision. The locations of regions 310 on the work piece 305 are referenced by the relative positions of work piece 305 and reference marks 392 and 395 and coordinate system 340. System 300 allows relative measurements between regions 310 and reference marks 392 to provide precision location information.

In some embodiments the reference marks 395 may comprise phase objects, amplitude objects or both. The reference marks 395 may further comprise features that enable 3D spatial location, and may comprise reference marks 395 that provide spatial location, angle, and Z depth information. One or more of the design, type, operation, and use of illumination systems 322a, 322b, measurement systems 360 and 370, and reference marks 395 may be related in order to achieve the highest precision measurements 365 and 375. In one or more systems 300 work piece 305 may comprise one of a reflective or a transmissive material. Furthermore, reference marks 395 designed to provide reflective information may comprise additive intensity regions that alternately absorb and reflect radiated light in the wavelengths of the light provided from the illumination systems 322a, 322b. Measurement systems 360 and 370 may then determine the necessary measurements from the reference marks 395 and other locations. The measurement systems 360, 370 may comprise an ability to store the measurements such as, but not limited, to, coding the measurements, and the measurement systems 360, 370 may further record 3D spatial information of the devices in the regions 310, among other areas, and produce location measurement estimates 365 and 375. The location measurement estimates 365, 375 may be related to the regions 310 and/or devices and/or work piece 305 and/or reference marks 395. Reference marks 395 are alternatively designed to provide phase information to the measurement systems 360, 370 and may comprise alternating phase regions where measurement systems 360 and 370 and/or illumination 322 are adapted to receive, and record the phase information and produce location measurement estimates.

In one embodiment measurement system 360 and 370 comprise, for example, imaging channels that may provide at least one of a phase and an amplitude optical measurement. The precision and field of view of system 300 with measurement systems 360 and 370 may also be adapted for measuring large curved work pieces 305 and may be used in systems 300 comprising large electromagnetic energy converters and/or planar work pieces. In one embodiment, the measurement precision system 300 may be better than lambda/100 where lambda is an operating wavelength of the device being measured. In another embodiment the measurement precision is better than lambda/100 where lambda is an operating wavelength of the measurement system 360, 370. In another embodiment the physical size of measurement systems 360 and 370 is very compact and the form factor is bounded by similar dimensions on all axes. For example, it is contemplated that measurement systems 360, 370 may comprise a size of about 1 cm³. However, other sizes are also contemplated and this size is not intended to limit the invention in any manner.

In one embodiment illumination systems 322a and 322b cooperate with optics 362 on measurement system 360 to form a phase imaging measurement system. In this system, the reference marks 392 have a phase component and are not only intensity objects. In another embodiment, illumination systems 322a and 322b cooperate with optics 362 on measurement system 360 to form a generalized dark field measurement system where the phase-containing reference marks 392 are imaged brighter or with a higher contrast than non-reference mark 392 areas, which may be referred to as background regions. Generalized dark field measurement systems implemented herein may be further configured to control an angle of illumination 322 relative to the work regions 310, and a relative angle to the axis of measurement systems 360 and 370 such as, but not limited to, the coordinate system 340. One or more apertures of measurement systems 360 and 370 may also be modified to substantially reduce and/or substantially remove any straight-through illumination or light not diffracted by the phase component of the reference marks.

In another embodiment a generalized dark field measurement system may comprise polarized light illumination systems 322, reference marks containing 392 containing phase components and/or polarization filters as part of measurement systems 360 and 370. Reference marks 392 may modify the illuminated polarization in such a way that it passes polarization filters in measurement systems 360 and 370, resulting in a higher recorded contrast for the reference marks 392 than the background. An example of this system comprises a linearly polarized illumination system operating relative to coordinate system 340. In such an embodiment, phase components of the reference marks 392 may be configured to act as ¼ wave plates relative to illumination bands of illumination systems 322. Such an embodiment may further comprise an orthogonal polarizing filter between the reference marks 392 and the measurement systems 360 and 370. The orthogonal polarizing filter acts to substantially reject straight-through illumination but passes through illumination that has been modified by the specialized reference marks 392. In another embodiment, illumination systems 322a and 322b may project specialized spatial and/or temporal patterns onto work piece 305. Measurement systems 360 and 370 use spatial and temporal patterns projected onto the work piece 305 to more accurately estimate the location of reference marks 392 and 395 as well as to determine the form error of regions 310. Illumination systems 322a and 322b may also project fringe patterns of alternating dark and light regions onto work piece 305. The period and spatial phase and/or color also changes as a function of time and may be synchronized with the measurement systems 360 and 370 in order to increase location measurement precision, reduce uncertainty and reject stray effects such as, but not limited to, stray effects caused by temperature variations and airborne particles.

Reference marks 392 may also comprise intensity marks, phase marks or a phase/intensity combination. In one embodiment the reference marks 395 are jointly designed with the measurement system 360. In another embodiment the reference marks 395 are jointly designed with the measurement system 360 and illumination systems 322a and 322b. In another embodiment the reference marks 395, measurement systems 360 and 370, and illumination systems 322a and 322b are jointly designed to cooperate with work piece 305 geometry and size. In another embodiment the reference marks 395 are jointly designed with the measurement system 360 to reduce the bandwidth of the measurements 365. For example, as described below, bandwidth may be reduced busing large pixels in an electromagnetic energy detector, which may detect and an object that subtends a large area. Using larger pixels in an electromagnetic energy detector than has been used previously provides less information as compared to the information provided from an electromagnetic energy detector having a greater number of smaller pixels since there are fewer pixels to sample and transmit.

Figure 4:
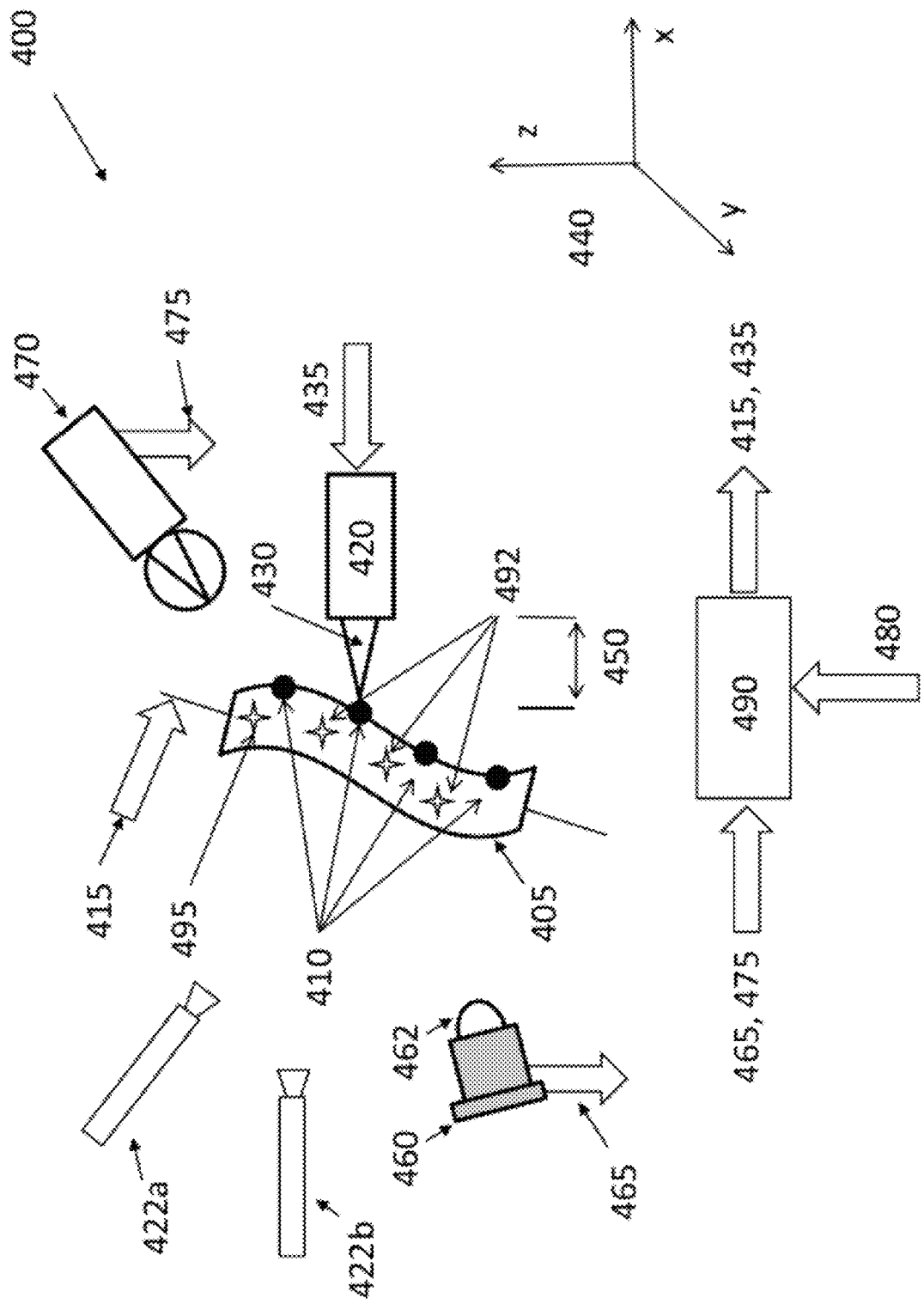
FIG. 4 illustrates a block diagram depicting a fabrication system according to one embodiment of the invention.

FIG. 4 is an embodiment of the invention as shown in system 400. Tool 430 is held by tool holder 420 and positioned to operate in regions 410 on work piece 405. Tool 430 and tool holder 420 and work piece 405 are positioned relative to coordinate system 440. Precision and accuracy of the locations of the regions 410 and precision and accuracy of the distance 450 depend on prior calibration and stability of the reference of tool 430, tool holder 420, and work piece 405 with and between coordinate system 440 operating in cooperation with measurement system 460 and 470 and control system 490. Measurement system 460 with optics 462 and measurement system 470 provide measurements 465 and 475 respectively by cooperating with illumination systems 422a and 422b and reference marks 492 and 495. Measurements 465 and 475 are combined with input 480 by control system 490 to form output signals 415 and 435. Output signal 415 influences the relative and absolute position of work piece 405 and output signal 435 influences the relative and absolute position of tool holder 420 and tool 430. The spacing 450 and locations of regions 410 formed on the work piece and the precision of the spacing and locations are thus dictated by the relative positions of work piece 405 and tool 430 instead of prior calibration of absolute positions. The precision of system 400 allows devices formed from regions 410 on work piece 405 to increase in complexity and value, and thus enjoy a cost/performance ratio that improves steadily, over time.

In one embodiment measurement system 460 and 470 are, for example, generalized Shack Hartmann systems that obtain phase and amplitude information with reference to a 3D location of reference marks 492. The precision and work volume of system 400 with such measurement systems 460 and 470 and with tool 430 enables the formation of large systems containing curved optics as well as large systems containing planar optics on work piece 405. In one embodiment the forming precision is better than lambda/4 where lambda is an operating wavelength of the device being formed on work piece 405. In another embodiment the forming precision is better than lambda/10 where lambda is an operating wavelength of the device being formed on work piece 405.

In one embodiment illumination systems 422*a* and 422*b* cooperate with optics 462 on measurement system 460 to obtain amplitude and generalized phase contrast measurements. In another embodiment illumination systems 422*a* and 422*b* cooperate with optics 462 on measurement system 460 to form a generalized dark field measurement system that acts to additionally reject potential dynamic particles from the measurements, when the dynamic particles are within the volume between measurement systems 460 and 470 and work piece 405. In one embodiment, the reference marks 492 and 495 are jointly designed with the measurement system 460 and geometry of tool 430. In another embodiment, the reference marks 492 are jointly designed with the measurement system 460 and control system 490 and reference mark 495 is a global reference to another work piece. In another embodiment the reference marks 492 and 495, measurement systems 460 and 470, and illumination systems 422*a* and 422*b* are jointly designed to cooperate with work piece 405 geometry and size and clearance of tool 430. Clearance of tool 430 comprises an ability to provide a cutting edge in the desired location without a shank, holder, or other physical attribute of tool 430 coming into contact with the work piece in an unintended fashion. In another embodiment the reference marks 492 are jointly designed with the measurement systems 460 and 470 to reduce at least one of communication bandwidth and electrical power of the measurements 465 and 475. Combinations of one or more portions of one or more embodiments described herein are contemplated. Furthermore, combinations of at least portions of various embodiments described throughout the application are also contemplated.

Reference marks 492 and 495 and measurement systems 460 and 470 are further configured to measure reference marks 492 and 495. For example, the distance of the reference marks 492, 495 from one or more edges of work piece 405 may be determined. In this configuration the marks 492, 495 may be located on one side of the work piece 405 and the material of work piece 405 may allow optical transmission measurements. In another configuration, the reference marks 492, 495 may be located on multiple surfaces of the work piece 405 and at least a portion of the material properties of the work piece may comprise at least one of a reflective and an opaque material.

In one embodiment, control system 490 is configured to accept measurements 465 and 475. Measurements 465 and 475 are further configured to cooperate with reference marks 492 to provide non-contact independent location feedback to control system 490. In another embodiment, measurements 465 and 475 are further configured to cooperate with reference marks 492 to provide in-situ non-contact 6-dimensional metrology. In another embodiment measurement systems 460 and 470 cooperate with reference marks 492 and with control system 490 and are configured to provide multi-system spatially coherent closed loop control. In another embodiment measurement systems 460 and 470 are jointly designed with reference marks 492 and control system 490 and configured to provide multi-system spatially coherent closed loop global control with a wide field of view.

The dimensions of work piece 405 are related to the precision of work regions 410. For example, if work piece 405 is small, say on the order of a few centimeters, then the maximum distance between any two work regions 410 is necessarily only a few centimeters. As system 400 can then produce the highest precision work regions 410 in 1, 2 or 3 dimensions, in an embodiment where illumination systems 422 and measurement systems 460 and 470 produce location estimates of reference marks 492 and 495 with 10 nm rms, control system 490 may provide output signals 415, 435 to a 20 nm rms, and tool holder 420, tool 430 and work piece position 415 may be adapted to form regions 410 to within 100 nm rms over part 405. If the dimensions of work piece 405 are bounded by 10 cm in x and y and z then the relative precision of devices formed in regions 410 could be 1 in 1,000,000 in any one axis over three axes.

Upon increasing the dimensions of work piece 405 by a factor of 10, to, for example, 100 cm in each dimension, then, at the same relative precision, work regions 410 could be made to a 1 micron rms. When the dimensions of work piece 405 are, for example, increased by a factor of 100 to 1 m in each dimension, then at the same relative precision work regions 410 could be made to 10 micron rms.

When making mechanical parts, larger part creation tolerances often influence part interoperability, interchangeability and size. When making optical parts, a tolerance beyond a wavelength threshold often produces ineffective parts. If an operating wavelength of an optical component or a system being fabricated is 0.5 microns, then parts made with an rms error large as compared to 0.5 microns would result in poor quality part production. While any one part may be physically small, the wavelength threshold translates to the entire group of parts on the substrate. For example, if a part is 1 mm in diameter, making production quantities of 5000 parts on one substrate means that the wavelength threshold translates to an effective diameter of 100 mm or more. By having larger relative precision, larger quantities of small parts can be fabricated in parallel, increasing yields and decreasing costs. By increasing the operating wavelength, and therefore the wavelength-dependent threshold, still larger quantities of small parts can be effectively fabricated with high yields and low costs.

In one embodiment, the precision of part production is better than lambda/100 where lambda is an operating wavelength of the device being formed. It is contemplated that throughout the specification, the term "part" may be interchanged with the word "device", where appropriate. Using the system 400 described herein, and the improved control and measurement precision associated with it, system 400 is used with at least one of 2, 3, 4, and 5 degree of freedom machine tool to provide devices with higher precision than may be provided without system 400. In one embodiment a closed-loop process may be applied to planar and non-planar substrates and work pieces 405 containing at least one of planar and non-planar reference marks 492. The forming process may comprise at least one of milling, machining, grinding, ion milling and e-beam material removal methods.

In another embodiment, the systems 200, 300 and 400 in FIGS. 2, 3, and 4, respectively, are used in a process for precision fabrication by using a sequence of blank preparation by system 200, placement of reference marks 492, 495, and precision reference mark measurement by system 300, and precision formation of features in regions 410 using system 400. The addition of known reference marks in known locations across work pieces for system 300 provides local control rather than global control for forming regions 410 using tool 430. Global control for work piece 405 and tool 430 is obtained by viewing a wide field of view of reference marks 492, 495. In this embodiment the process of using systems 200, 300, and 400 in sequence gains cumulative benefits of the improved precision of each of the systems.

In another embodiment the systems 300 and 400 are further used in a process for nano-imprint lithography to form planar and non-planar structures. Single and multi-layer nano-featured structures are achieved with nanometer precision using system 400. The location of single and multi-layer nano-featured structures is controlled with nanometer precision using system 300. Systems 200, 300 and 400 are further configured to use a machining process for precision fabrication and also a nano-imprint lithography process wherein the nano-featured structures are achieved with nanometer precision on a work piece 405 that was previously or concurrently formed in a process for precision fabrication using systems 200, 300, and 400. Systems 200, 300 and 400 are further configured to use a machining process for precision fabrication, a nano-imprint lithography process for nano-featured structures, and a second machining operation to at least affect an existing nano-featured structure and form further features on work piece 405. The nano-featured structures act to modify the behavior of electromagnetic radiation in optical components, such as reflection, absorption, polarization and stray-light control, as well as to control aberrations and reduce the size of the fabricated devices through generalized gradient index structures. When different layers of nanostructures and materials are composed of insulators, conductors and N or P-type materials and arranged in well known patterns, electric circuits are formed on or within specialized components.

Figure 5:
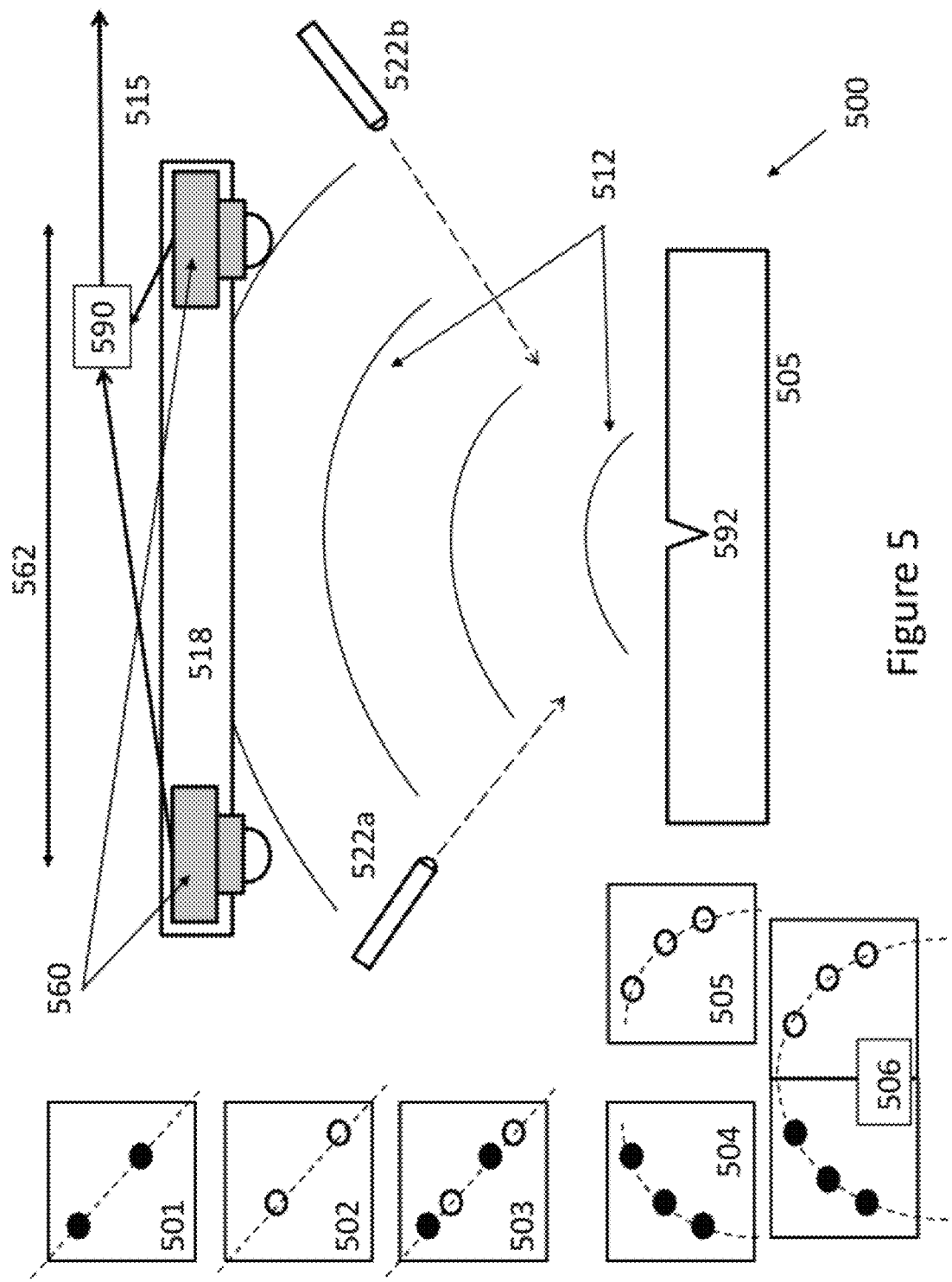
FIG. 5 illustrates a block diagram depicting a measurement system according to one embodiment of the invention.

FIG. 5 is an embodiment of the invention shown as system 500. Measurement systems 560 provide location information about reference mark 592. Reference mark 592 may work with illumination systems 522*a*, 522*b* to operatively provide information to measurement systems 560, which may then send data to measurement processor 590 to form measurements 515. Measurement systems 560 are separated by a distance 562 and mounted on a stable platform 518 to capture a wide field of information 512. The precision of system 500 allows devices formed on work piece 505 to enjoy benefit of a cost/performance ratio that improves steadily over time. The precision of system 500 allows relative measurements between reference marks 592 and measurement systems 560 to provide improved location information.

Measurement processor 590 acts to perform spatially coherent processing of the information captured by measurement systems 560. When processor 590 is operated in an incoherent fashion each of the sensors 560 forms an independent estimate of the location of reference mark 592. Such estimates are combined by, for example, using averaging to form a reduced noise spatially incoherent estimate of reference mark 592 location. In another embodiment, processor 590 may be operated in a spatially coherent fashion and data received from each of the sensors 560 may be combined and an estimate of the location of reference mark 592 may be formed by using the data together. For example, data may be combined by adding the fields of view as shown as combined data points 503 where data points are combined from a first field of view 501 and a second field of view 502. In each of the first field of view 501 and the second field of view 502, two data points and a linear fit is obtained, as indicated by the dashed lines. The linear fits from the first field of view 501 and the second field of view 502 may then be averaged to form an incoherent slope estimate. Data points 503, however, are used to form a spatially coherent linear fit as indicated by the dashed line. In another embodiment, the combining of data may comprise the abutting and stitching of adjacent fields of view. In yet another embodiment, the combining of data may comprise the fitting of sensor outputs 560 to a single polynomial estimate of wavefront phase and amplitude and estimating the location of mark 592 with the wavefront estimate. For example, image 506 is obtained by abutting images 504 and 505. The six data points in image 506 are then used to form a polynomial estimate. In images 504 and 505, only three data points are available to form a polynomial estimate. The polynomial estimates from 504 and 505 may be combined to form an incoherent polynomial estimate. Knowledge of physical geometry relating first field of view 501 and second field of view 502, as well as images 504 and 505, may be used to form the combined data points 503 and image 506. Without such knowledge, only the incoherent estimates may be formed in each case.

Measurement systems 560 may comprise generalized Shack-Hartmann implementations that provide at least one of phase and amplitude optical measurements in a spatially coherent configuration. In another embodiment, measurement systems 560 may comprise generalized dark field systems.

In one embodiment the work piece 505 is reflective and reference marks 592 are specular reflective. In such an embodiment, measurements 515, cooperating with illumination systems 522, may gain an increased signal to noise ratio. A signal returned from the reference marks 592 configured as specular reflectors may comprise a greater contrast as compared to a weaker background illumination reflected away from measurement system 560. In this embodiment, the illumination system is also considered a generalized dark field illumination system. In another generalized dark field embodiment, the illumination systems 522*a*, 522*b* using polarized illumination and polarizing filters between the reference marks 592 and measurement systems 560 may be configured to be substantially collinear and coaxial to measurement systems 560.

In cases when reference mark 592 is presented in both fields of view of systems 560 the processing 590 is, for example, performed in a spatially coherent fashion. In some configurations independent fields of view of measurement systems 560 will not completely overlap in some locations on work pieces 505 in which case the spatial coherence of system 500 cannot be leveraged. Changing the overlap of the fields of view by curving the rigid construct 518 provides an improved overlap region and ability to operate on wider range of geometries of part 505 as can be seen by system 600 in FIG. 6.

Figure 6:
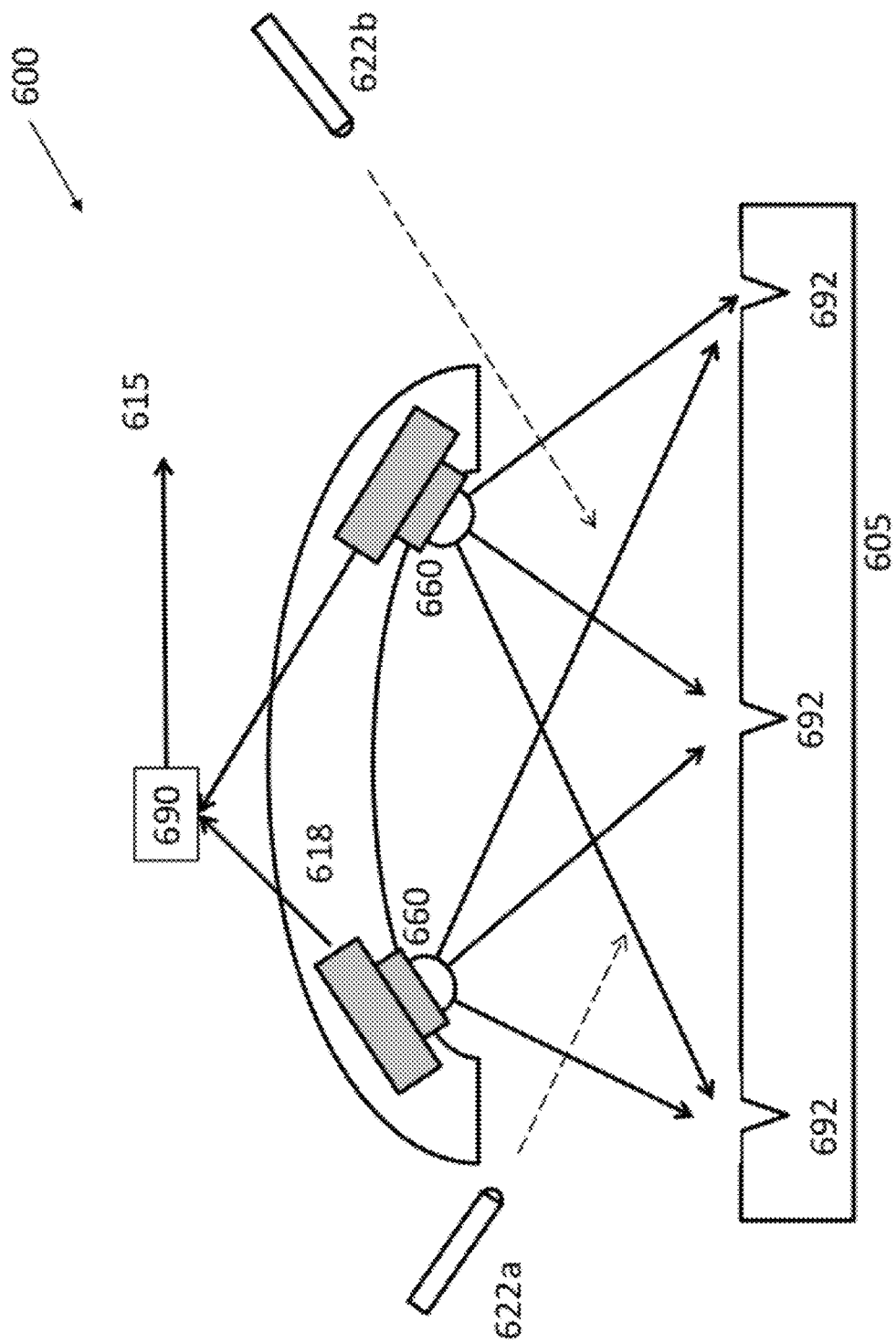
FIG. 6 illustrates a block diagram depicting a measurement system according to one embodiment of the invention.

FIG. 6 is an embodiment of the invention shown as system 600. Measurement systems 660 provide location information about reference marks 692. Reference marks 692 cooperate with measurement systems 660 and measurement processor 690 and illumination systems 622*a* and 622*b* to form measurements 615. Measurement systems 660 are mounted on a mechanically stable curved platform 618 to capture a curved field of information. The precision of system 600 allows relative measurements between reference marks 692 and measurement systems 660 to provide improved location information.

In cases when reference marks 692 are presented in the fields of view of both systems 660, the processing 690 may be performed in a spatially coherent fashion. On one embodiment, the independent fields of view of measurement systems 660 may be further configured to at least partially overlap in one or more desired locations on work piece 605. In such a system 600, the spatial coherence is leveraged across the work piece 605. Processor 690 may be further configured to provide measurements 615 at a temporal rate that is sufficient for closed-loop control speed so that a system time constant may be small when compared to open loop control. Operation time of system 600 is not significantly increased compared to prior art. For example, machining nominal volumes for devices may normally take several days to several weeks of machining operation. Forming estimates at 30 frames/second (33 milliseconds/frame) induces a total delay of the final machined work piece 605 by 33 milliseconds over the day to week duration of machining.

Figure 7:
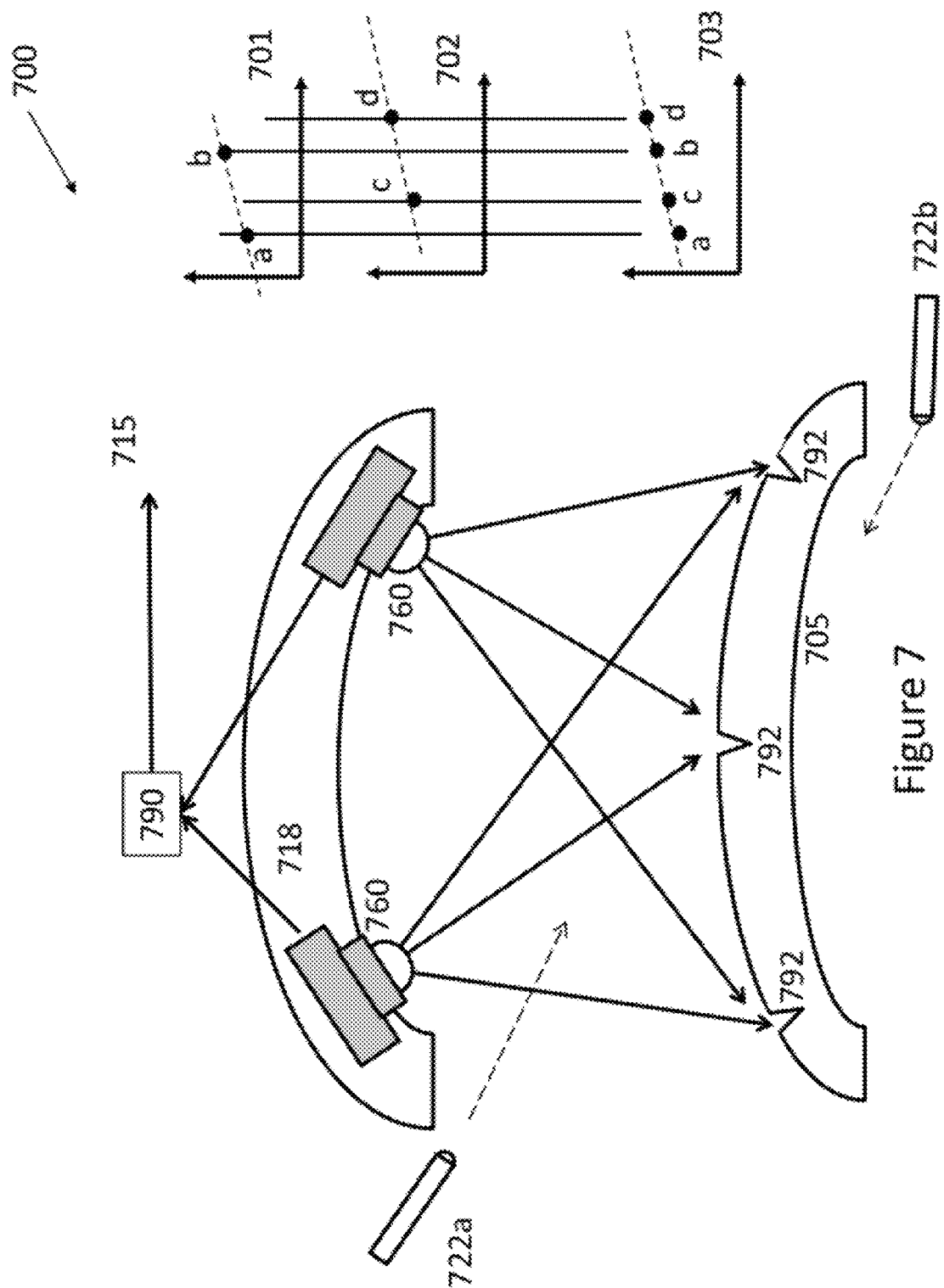
FIG. 7 illustrates a block diagram depicting a measurement system according to one embodiment of the invention.

FIG. 7 is an embodiment of the invention shown as system 700. Measurement systems 760 provide location information about reference marks 792. Throughout the application, it is contemplated that the term "location information" may comprise distance measurements in any axis—such as, but not limited to, x, y, z, ρ, ϕ, and θ, where appropriate. Reference marks 792 cooperate with measurement systems 760, measurement processor 790, and illumination systems 722a and 722b to form measurements 715. Measurements 715 may comprise distance information of the location of the reference marks 792. Illumination systems 722a, 722b may be, for example, configured on opposing sides of curved work piece 705 and provide first location estimates by using at least one of a transmission, reflection, polarization and opaqueness measurement. The first location estimates may be provided to the processor 790. Measurement systems 760 may be mounted on a mechanically stable curved platform 718. The first location estimates may be used with second location estimates determined from measurements systems 760 by the processor 790 to obtain measurements 715. The precision of system 700 allows relative measurements between reference marks 792 and measurement systems 760 to provide improved location information.

In cases when reference marks 792 are presented in both fields of view of systems 760 the processing 790 may be performed in a spatially coherent fashion. The independent fields of view of measurement systems 760 may be further configured to completely overlap in desired locations on work piece 705 in which case the spatial coherence of system 700 is leveraged across the curved work piece 705. In system 700 measurement systems 760 and reference marks 792 may be optimized with illumination systems 722a and 722b to reject background scatter from work piece 705 and determine the relative location of reference marks 792 by using polarized illumination and tailored phase-components of the reference marks 792 wherein the electromagnetic energy returned from the reference marks 792 is polarized differently than the electromagnetic energy returned from the work piece 705. In another embodiment, the difference in polarization may result in orthogonal polarization.

Spatially coherent processing is illustrated in FIG. 7 with processing steps 701, 702 and 703. Each step 701, 702, 703 comprises computing a slope of a linear fit to a sample measurement data set, with process 703 computing a spatially coherent slope. In step 701, the slope of a line connecting points 'a' and 'b' is computed as m1=(by−ay)/(bx−ax) where 'bx' is the x-location of the sample point 'b', 'by' is the y-location of the sample point 'b', and similarly with 'ax' and 'ay'. In method 702 the slope of a line connecting points 'c' and 'd' is computed as m2=(dy−cy)/(dx−cx) where 'dx' is the x-location of the sample point 'd', 'dy' is the y-location of the sample point 'd', and similarly with 'cx' and 'cy'. The final slope m(final) in step 703 for the data set [a, b, c, d] is then computed as the average slopes of steps 701 and 702 where m(final)=(m1+m2)/2. The final slope using methods 701 and 702 may be computed incoherently. In step 703 the slope may be determined using knowledge of the relationship between sampling in steps 701 and 702. For example, in step 703, sample points [a, b, c, d] are placed on a common axis and a slope is calculated by solving for 'm(final)' in the linear equation y=mx where x=[ax bx cx dx]' and y=[ay by cy dy]'.

Figure 8:
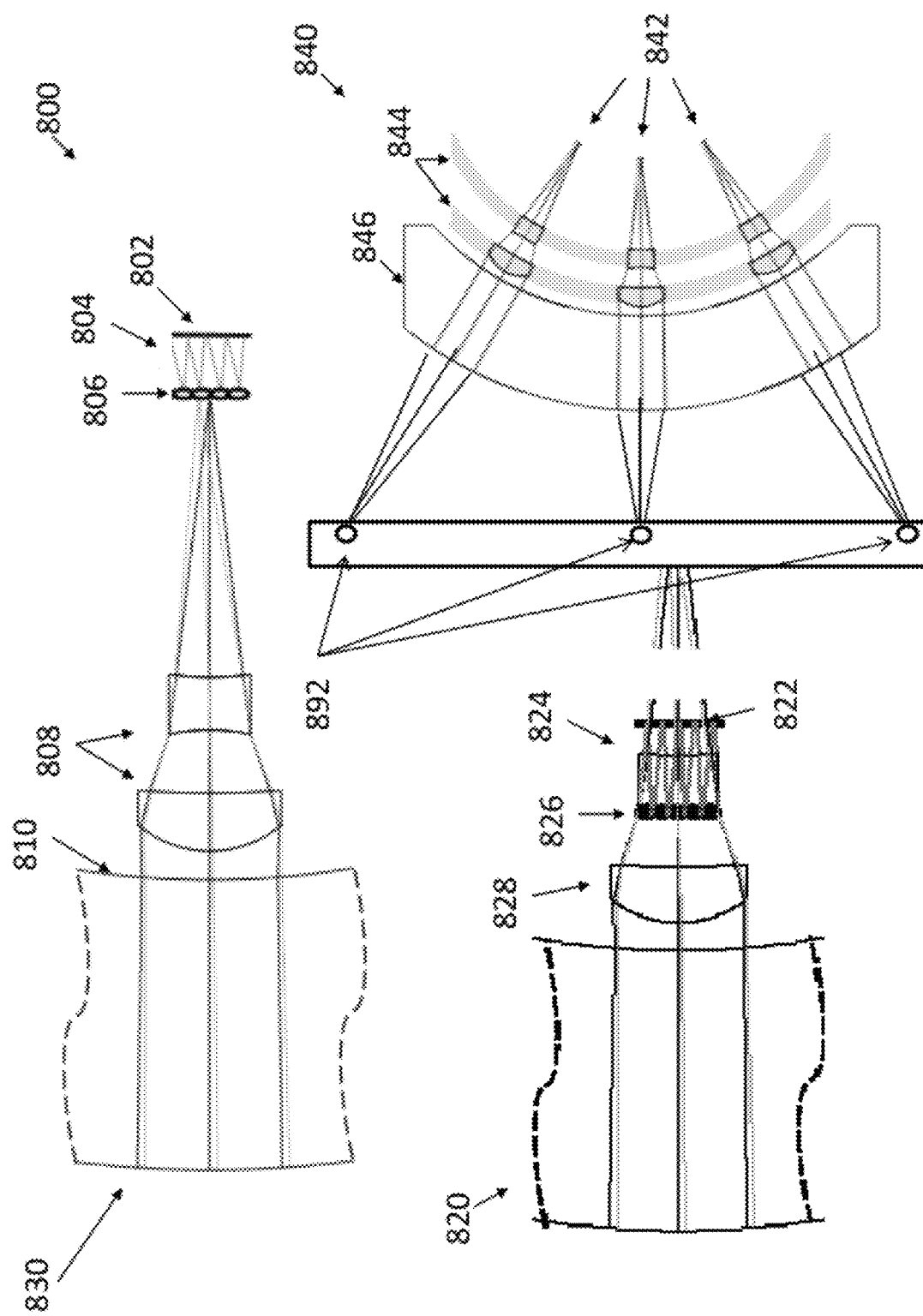
FIG. 8 illustrates a block diagram depicting an imaging system according to one embodiment of the invention.

FIG. 8 is an embodiment of the invention shown as system 800. Measurement system 840 comprises at least one of a wavefront measurement channel 820 and a generalized Shack-Hartmann measurement channel 830. The measurement system 480 further comprises common optics 846 and 844 and electromagnetic energy detectors 842. In channel 820 a wavefront from a common optic 828 is presented to a micro lens array 826 that focuses portions of the wavefront 824 onto electromagnetic energy detectors 822. The location of the focused portions of the wavefront 824 on the detectors 822 represents a sampled wavefront phase and the intensity of the focused portions of the wavefront 824 represents a wavefront amplitude. In channel 830, a micro lens array 806 is placed beyond the focal point of common optics 810 and 808. Electromagnetic energy detectors 802 cooperate with micro lens array 806 and light field 804 to form wavefront estimations related to micro lens positions and curvatures in micro lens array 806. Channel 830 also allows a manipulation of the wavefront to reduce the effects of aberrations on final measurements and electronic refocusing. For example, computational imaging techniques that modify phase, color, and/or spherical aberrations may provide an extended depth of focus. The field of view of the measurement channels 830 and 820 cooperates with reference marks 892 to obtain high resolution location information. The precision of system 800 allows relative measurements between reference marks 892 and measurement system 840 to provide improved location information over a wide field of view.

Figure 9:
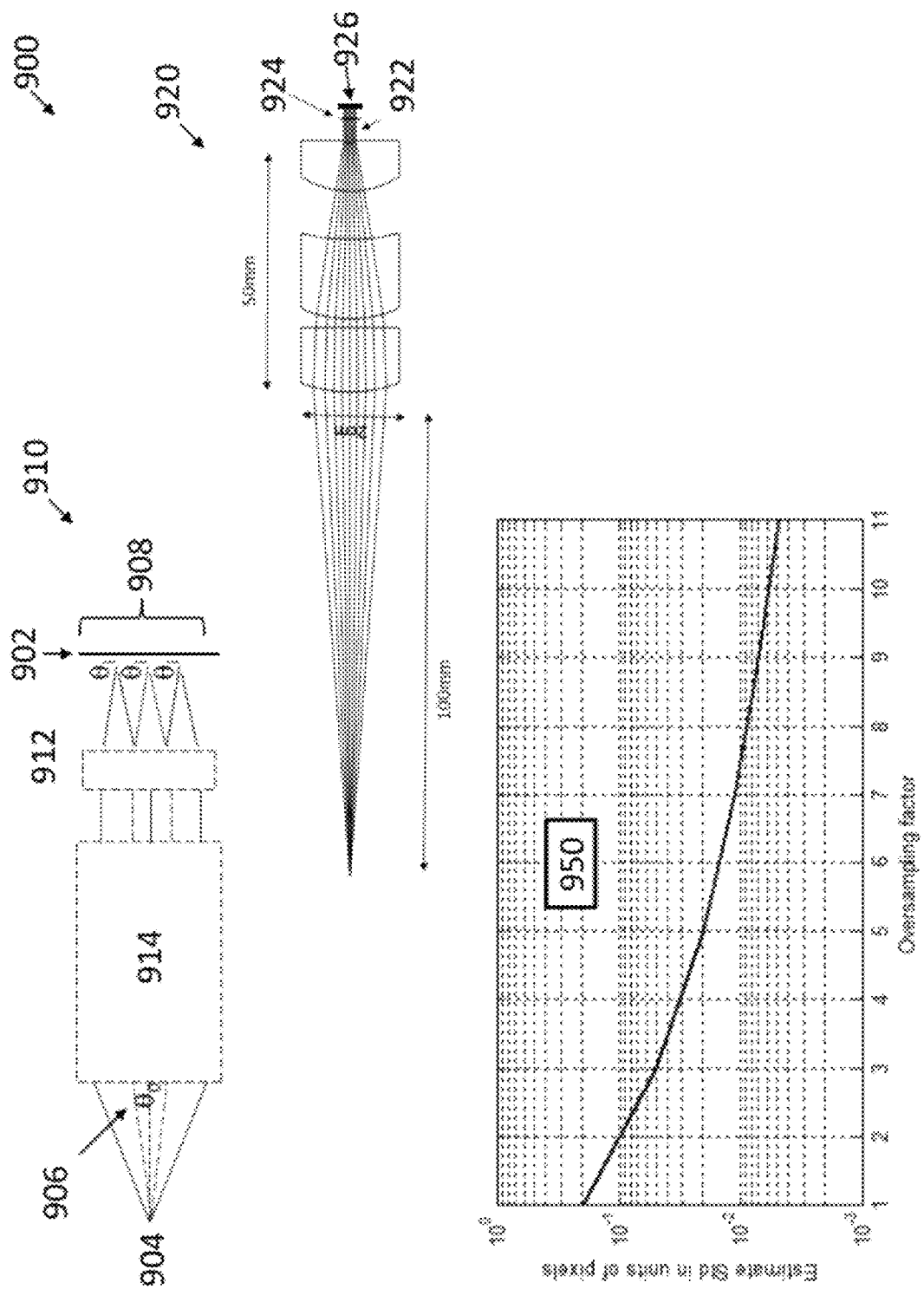
FIG. 9 illustrates a block diagram depicting an imaging system according to one embodiment of the invention.

FIG. 9 is an embodiment of the invention shown as system 900. One system 900 includes an imaging channel 910. The layout of the imaging channel 910 includes infinity corrected optics or an objective 914 and captures light information from the reference marks 904. A micro lens array 912 focuses light from the exit pupil of the objective 914 to one or more electromagnetic energy detectors 902. The micro lens array 912 separates the complex exit pupil light onto separate regions 908 of the electromagnetic energy detector 902, enabling a spatially coherent imaging configuration of the region/device measured. Three dimensional spatial information of a measured object such as, but not limited to, a reference mark 904, may be obtained with a single objective 914 using the imaging channel 910 where the relative precision of a distance estimation error is inversely related to the sine of the angle 906 between one or more chief rays of a marginal measurement channel and an on-axis measurement channel, measured at the objective or reference marks 904.

Seen in system 920 is a 5× magnification objective design with a working distance of 100 mm and is near diffraction-limited. The diameter of the output beam 922 is approximately 3 mm, allowing for micro lens array 924 to be created for this size. When 1.0 mm diameter elements in the micro lens array 924 are created, a working F/# related to each micro lens element is about 75 with visible light. In one embodiment, all optical materials in system 920 are assumed the same with an index of refraction of n=1.5168 in visible light. The length of the overall system is shown in system 920 and is determined by the objective working distance, the length of the objective and the back focal length, which in FIG. 9 comprises the distance between the micro lens array 912 and the electromagnetic energy detector 902. Rays 922 are substantially parallel and are focused on the electromagnetic energy detector 926 using micro lens array 924. The lens prescription for 920 is shown below:

| Surf # | Type | Radius | Thickness | Material | Semi-Diameter |
|---|---|---|---|---|---|
| Obj | Standard | Inf | 100 | | |
| 1 | Standard | 28.311349 | 13.3 | n = 1.5168 | 10 |
| 2 | Standard | −611.858928 | 1.789655 | | 10 |
| 3 | Standard | 23.991505 | 16.411001 | n = 1.5168 | 10 |
| 4 | Standard | 37.697446 | 10 | | 10 |
| 5 | Standard | 18.108405 | 10 | n = 1.5168 | 10 |
| 6 | Even Asphere | 2.675589 | 5 | | 1.5 |
| 7 | Standard | 14.662668 | 0 | n = 1.5168 | 1.5 |
| Stop | Standard | Inf | 79 | | 0.5 |
| Img | | | | | | where all units are in mm

Surface 6 rotationally symmetric aspheric coefficients ($4^{th}$ through $10^{th}$ order terms) are:

[−1.32354e-3, −5.998033e-4, −9.655656e-14, 4.750577e-14]

Plot 950 in system 900 describes an oversampling factor vs. a two dimensional position estimation standard deviation for a single measurement channel with a 10 bit electromagnetic energy detector 926, 902 having 2 bits of noise and simple and fast centroid processing. An oversampling factor of 1 comprises when a pixel size in the detector 926 equals two times an ideal working F/# times an illumination wavelength. Larger pixels correspond to larger oversampling factors. A classical diffraction-limited imaging system may be used as provided in Eq. 1 where x(i, j) is the sampled pixel location and I(i, j) is the intensity for the $(i, j)^{th}$ pixel, respectively.

$$cx = \frac{\sum_{i,j} x_{i,j} I_{i,j}}{\sum_{i,j} I_{i,j}}, \; cy = \frac{\sum_{i,j} y_{i,j} I_{i,j}}{\sum_{i,j} I_{i,j}} \qquad (Eq.\ 1)$$

For even this type of fast processing, the standard deviation of measurement estimation is approximately 1/500 with an oversampling factor of 10. One system 920 has an oversampling value of 10 when the detector pixel size is approximately 1.8 microns.

For geometries having a single objective 914 and fast objectives 914, for example, an F/# about equal to 1.0, the relative precision between the X/Y dimensions and Z dimension is, for example, around a factor of 5. Relatively slow working F/#s, for example, an F/# about equal to 20.0, act to increase the depth of field of the imaging system seen in system 900, but such slow-working F/#s also act to decrease the precision of a Z dimension estimation. Increasing the complexity of infinity corrected optics, reducing the size of the detector pixels and increasing the estimation precision can all be used to reduce the system length. As illumination power, within limits, can be considered a free variable, larger oversampling results in a larger Signal-to-Noise Ratio ("SNR") and therefore lower estimation error. When the optics are considered substantially diffraction-limited, an oversampling factor of 10 with 2 micron pixels translates to a working F/# ~=80 for each measurement channel. This working F/# then dictates a ratio of the diameter of the aperture of the micro lens array 924 to the back focal length of the elements of the micro lens array 924.

Further system 900 design considerations include the effects of changing magnification. The magnification of the objective 914 determines the degree of sub-pixel estimation precision required on each image channel to reach the precision error rms x, y, z system goal. A larger magnification simplifies illumination while decreasing the needed sub-pixel estimation precision. A larger magnification also complicates the objective optics and increases the system length. For example, with a 5× magnification, 1 nm rms X/Y estimation precision with 2 micron pixels may require a sub-pixel estimation accuracy of <1/400th of a pixel.

Figure 10:
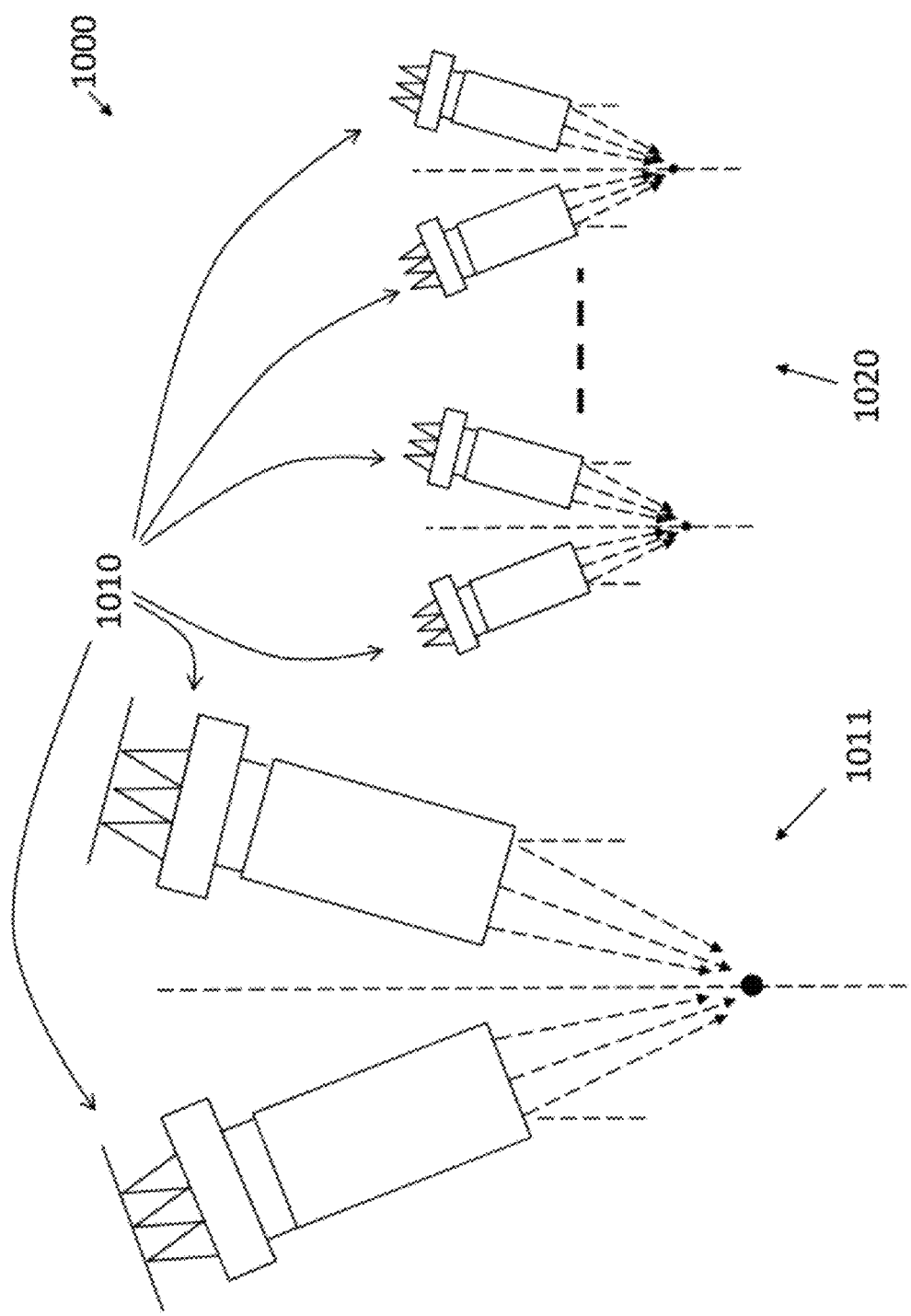
FIG. 10 illustrates a block diagram depicting an imaging system according to one embodiment of the invention.

FIG. 10 is an embodiment of the invention shown as system 1000. In system 1000 multiple imaging channels 1010 can be used to achieve a wide range of chief ray angles, as disclosed as angle 906 in FIG. 9. In the single-system of FIG. 9, angles 906 of chief rays for each micro lens element channel are limited by the diameter of the entrance pupil. In systems 1011 and 1020 each imaging channel 1010 is spatially coherent to each other, as in the single entrance pupil case of FIG. 9. In system 1011a plurality of imaging channels 1010 are forming spatially coherent measurements of a reference mark. In system 1020, an array of a plurality of imaging channels 1010 form spatially coherent measurements of a multitude of reference marks. The plurality of imaging channels 1010 of system 1000 can be used to achieve a wider range of chief ray angles and thus a smaller Z estimation error than using a single imaging channel 1010.

In one embodiment each imaging channels 1010 are for example generalized Shack-Hartmann implementations that provide both phase and amplitude measurements. In another embodiment channels 1010 are further configured to provide a spatially coherent measurement of phase and amplitude. In another embodiment, channels in system 1020 are further configured to provide a wider spatially coherent measurement field of view of phase and amplitude than system 1011.

Figure 11:
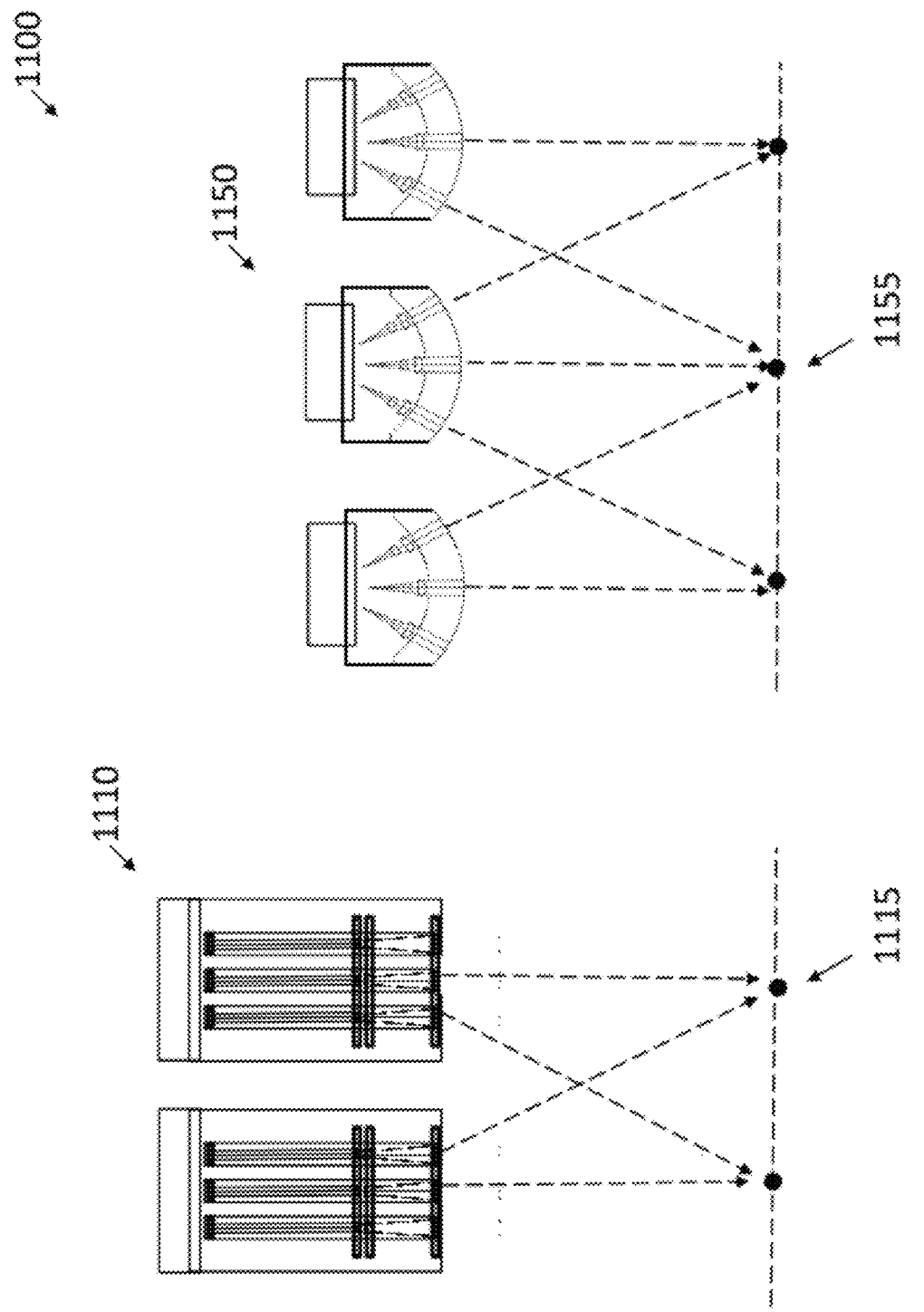
FIG. 11 illustrates a block diagram depicting an imaging system according to one embodiment of the invention.

FIG. 11 is an embodiment of the invention showing two measurement systems 1100. In the two measurement systems 1100 one or more multi-aperture planar systems 1110 can be used with closed loop control to fabricate curved substrate measurement systems 1150. Fabrication of a curved substrate may be accomplished by system 400 in FIG. 4 by using one or more multi-aperture planar systems 1110 to provide measurements 465 and 475. The precision of the measurements 465, 475 from the multi-aperture planar systems 1110 used in system 400 is suitable to enable work piece 405 to be a non-planar form. Work piece 405 may then be fabricated to be a multi-aperture curved system 11150. Each multi-aperture planar system 1110 comprises a first set of a plurality of imaging channels such as, but not limited to, the imaging channels 910, 1010 seen in FIGS. 9 and 10, and a second set of the plurality of imaging channels 910, 1010. Similarly, the curved substrate measurement systems 1150 may also comprise a first set of a plurality of imaging channels 910, 1010 and at least one second set of a plurality of imaging channels 910, 1010. As seen in FIG. 3, the at least one second set of a plurality of imaging channels 910, 1010 comprises two second sets of a plurality of imaging channels 910, 1010. The one or more multi-aperture planar systems 1110 use beam steering via off-axis lens sections to achieve high quality measurement precision over a field of view ("FOV") limited to approximately 10-15 degrees. A long working distance is needed to compensate for narrow FOV and the imaging performance degrades with increasing field of view. The working diameter and volumes limited in the configuration of throne or more multi-aperture planar systems 1110. The multi-aperture curved system 1150 enables large fields of view to nearly 180° in the measurement configuration. System 1150 provides the shortest possible working distance with diffraction-limited imaging and the highest sensitivity. Ideal imaging performance is independent of field of view in system 1150. System 1150 further provides the most compact configuration for refractive, diffractive, reflective or catadioptric components. Working diameter and volumes can be very large, on the order of meters or larger. System 1150 enables practical and widespread use of system 400.

Figure 12:
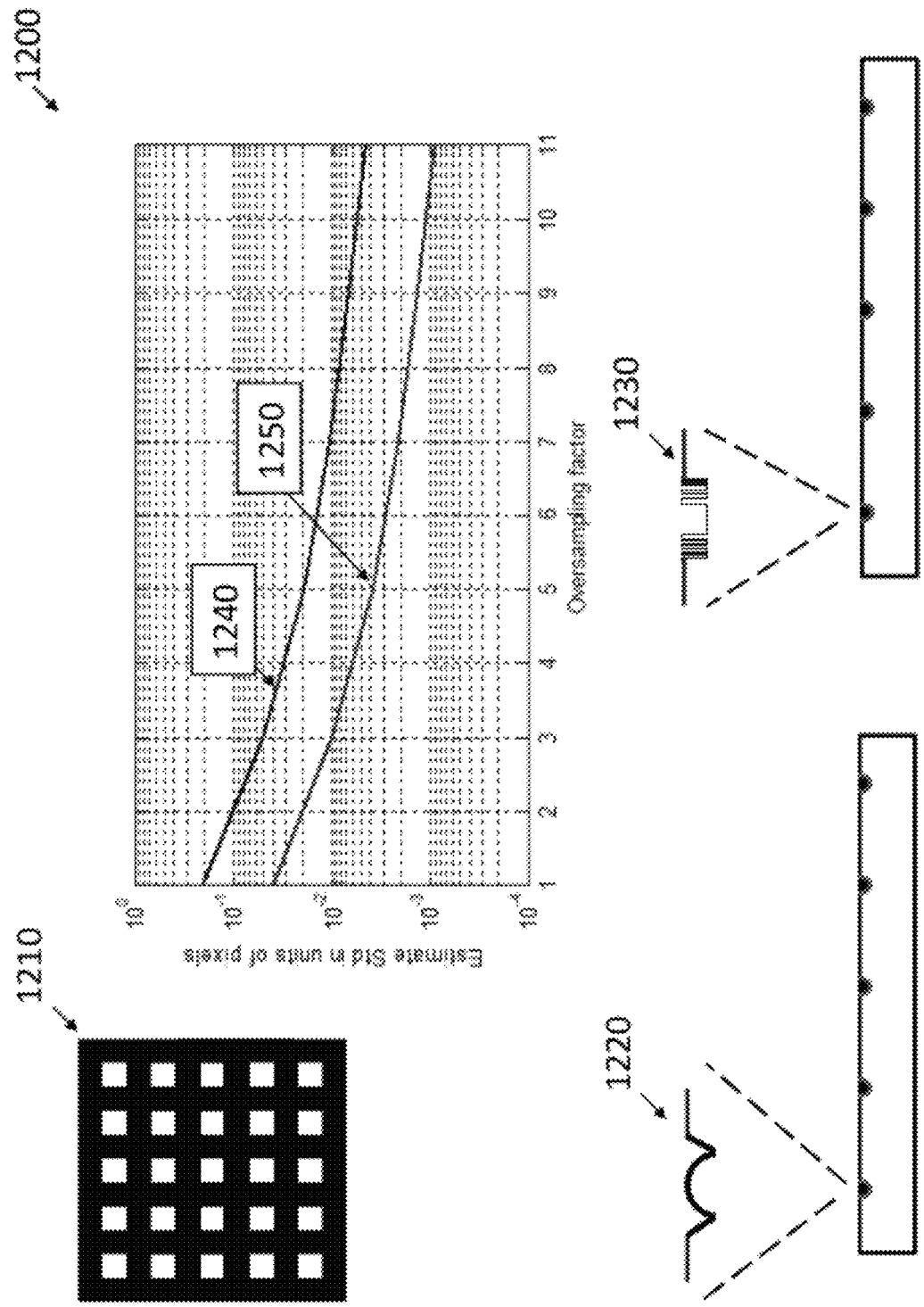
FIG. 12 illustrates a representation of a plurality of reference marks and reference mark performance according to one embodiment of the invention.

FIG. 12 is an embodiment of the invention shown as system 1200. Reference mark 1210 is formed from at least one of a phase and amplitude and the design depends on the remote sensing configuration. Reference mark 1210 is configured to be at least one of a planar reference mark and a non-planar reference mark. Reference mark 1210 also contains at least one of a refractive, diffractive, polarizing and attenuating feature. In one embodiment, reference marks similar to reference mark 1210 are applied to a work piece such as, but not limited to work piece 405 seen in FIG. 4 through a simple "peel-and-stick" operation. In other embodiments reference marks 1210 are directly machined, milled, ground, or replicated onto and into the work piece 405. When the reference mark 1210 is a series of surface height changes in a reflective or translucent work piece 405, then a generalized phase contrast imaging method is suitable for the measurement system such as, but not limited to, measurement systems 460, 470, in order to convert the reference mark phase into recorded intensity.

The graph in system 1200 shows a performance line 1240 for a reference mark 1210 that may comprise a point mark. In one embodiment such a reference mark 1210 may comprise an intensity mark (a bright region on a dark background). Using a reference mark 1210 that is a 5×5 region of alternative bright/dark regions, as seen in FIG. 12 performance line 1250 is produced, as compared to the performance line 1240 for a point reference mark 1210 in line 1240. Increasing the extent and complexity of the reference mark 1210 can greatly increase the performance of the position estimation.

Reference mark 1220 of system 1200 is one embodiment of the invention and may be formed using at least one of milling or plunging surface to form a specular reflector. The area surrounding reference mark 1220 is, for example, further configured to be at least one of a scatterer and an absorber of one or more illuminated wavelengths. The diameter of reference mark 1220 may be small as compared to an imaging resolution of the imaging channel, such as, but not limited to, the imaging channels 910, 1010, 1110 seen in FIGS. 9-11. For an ideal F/40 system with magnification of 4, reference mark 1220 may comprise a diameter of approximately 2-5 microns, which may be smaller than an ideal Point Spread Function ("PSF") width in visible light.

Reference mark 1230 may be formed from at least one of milling, etching, replication and scribing such that reference mark 1230 may act like a reflector under expected viewing angles. The area surrounding reference mark 1230 may be, for example, further configured to be at least one of a scatterer or absorber of one or more illuminated wavelengths. With simple and fast processing algorithms at least a linear increase in estimation precision may be achieved, or 5× with a 5×5 grid object 1230 compared to an ideal point source. With a 10× oversampling factor the estimation precision can be about $\frac{1}{1000}^{th}$ of a pixel.

It is very difficult to practically illuminate a reference mark 1210, 1220, 1230 when the reference mark 1210, 1220, 1230 is a point object. While a point object is a simple object to analyze systems with, it is a difficult object to reproduce in practice. Goals for reference mark 1210, 1220, 1230 use include ease of fabrication and measurement and relatively low cost. The reference mark 1210, 1220, 1230 may also provide spatial location and angle information. The configuration of reference mark 1210 is a 2D grating with square corners. Two dimensional gratings maybe milled or lithographically generated and then positioned on the work piece such as, but not limited to the work piece 405 seen in FIG. 4. Due to the large sampled PSFs (~Twenty two-micron pixels with 4× magnification), the dimensions of the features of such a grid reference mark 1210 can be on the order of about 5-10 microns.

In one embodiment, the period and outer dimensions of the 2D grating in reference mark 1210 provides angular information, while the center of mass provides spatial location information. In one embodiment, using FIG. 12 and FIG. 9, a micro lens array 912 and 924 used in the system 900 as shown in FIG. 9, but with a 35 mm working distance, chief rays from adjacent micro lens elements 902 images with a +/−10 degree angle to the reference mark 904 allowing significant angular separation between measurements. While the coherent application of sub-images formed from different micro lenses 912 and 924 determines Z information, individual sub-images determine x, y spatial location and angle to the plane of the reference mark 1210, relative to the particular chief-ray. Signal processing with reference marks 1210, 1220 and 1230 can be provided by a separable centroid algorithm to estimate spatial location and separable second moment algorithms to measure angle to the reference mark 1210, 1220, 1230. Geometric information coupled with individual estimates from sub-images forms Z estimates.

Figure 13:
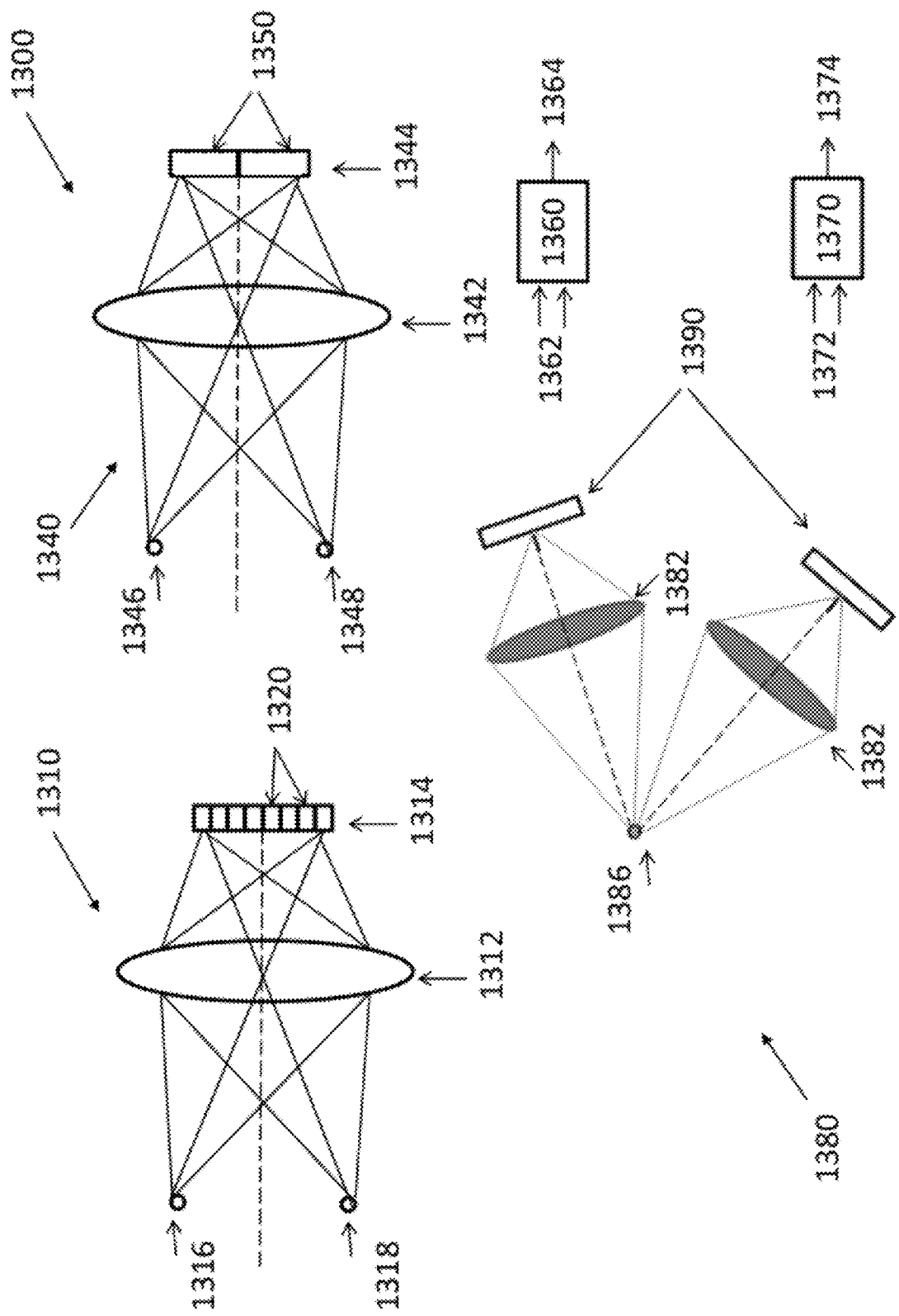
FIG. 13 illustrates a block diagram depicting a portion of a measurement system according to one embodiment of the invention.

FIG. 13 comprises an embodiment of the invention shown as systems 1340 and 1380, with system 1310 an example of prior art. In system 1310, imaging optics 1312 are matched to electromagnetic energy detector 1314 so that each object 1316 and 1318 can be resolved by a small number of pixels 1320 in electromagnetic energy detector 1314. Pixels 1320 and image resolution are matched as by the Nyquist criterion. System 1310 contains no assumption on object 1316 and 1318 density or object 1316 and 1318 sparseness. In system 1340, pixels 1350 of energy detector 1344 are at least 2× larger than final object 1346 and 1348 spatial resolution. Optics 1342 collect object information but do not classically image. System 1340 uses the assumption that the density of the objects 1346 and 1348 is similar to the electromagnetic energy detector 1344 pixel density. For example, if there is a single object in the field of view then detection is a binary problem and only a single detector is necessary to detect the object (it is either present, or not present, in the field of view). Only a single information frame needs to be sampled in one embodiment. By using large pixels 1350 matched to object 1346, 1348 density as compared to pixels 1320 matched to object 1346, 1348 spatial resolution, system 1340 may comprise greater low-light sensitivity and use less power than prior art system 1310. Therefore, system 1340 may comprise a lower (i) system cost, (ii) communication bandwidth, and (iii) needed electrical power than in the classical sampling case in system 1310. Data 1362 from pixels 1350 in system 1340 are processed by processing device 1360 to produce a result 1364 that may comprise a location of the objects 1346, 1348.

System 1380 is another embodiment of the invention. Information gathering pixels 1390 are distributed about multi-aperture optics 1382. Multi-aperture optics 1382 can be singulated (as shown) or combined in a common optic format as shown by common optics 844 in FIG. 8. Single pixels 1390 and only a single object 1386 are assumed within the field of view of the system 1380. Pixels 1390 are larger than final object 1386 spatial resolution. Multi-aperture optics 1382 collects object 1386 information but do not image. Assumption that the density of the objects 1386 is matched to the pixel 1390 density. For example, in general infra-red imaging, only isolated hot objects are imaged. A more specific such example comprises a human signature (heat) or vehicle (hot exhaust) imaged against a generally uniform background of cooler temperatures like the sky or a field of grass. Only a single information frame needs to be sampled. Large pixels increase low-light sensitivity and reduce system cost and communication bandwidth compared to the classical sampling case.

An embodiment of systems 1340 and 1380 uses large electromagnetic energy detectors with intensity coding optics such as the optics disclosed in FIGS. 16 and 18, below, that provide PSFs engineered for pixel sizes, where locations of specialized objects or reference marks are estimated to a much finer precision than detector spacing. Optics 1342 and multi-aperture optics 1382 may comprise intensity coding optics 1342 and 1382 which may provide intensity coded information to pixels 1350 and 1390 respectively. Optics 1382 and multi-aperture optics 1342 in such an embodiment may comprise one of planar and 3D optics. One embodiment is also used with one of planar and 3D work pieces containing objects 1346 and 1348. Data 1372 from pixels 1390 in system 1380 are processed by processor 1370 to produce a result 1374.

Figure 14:
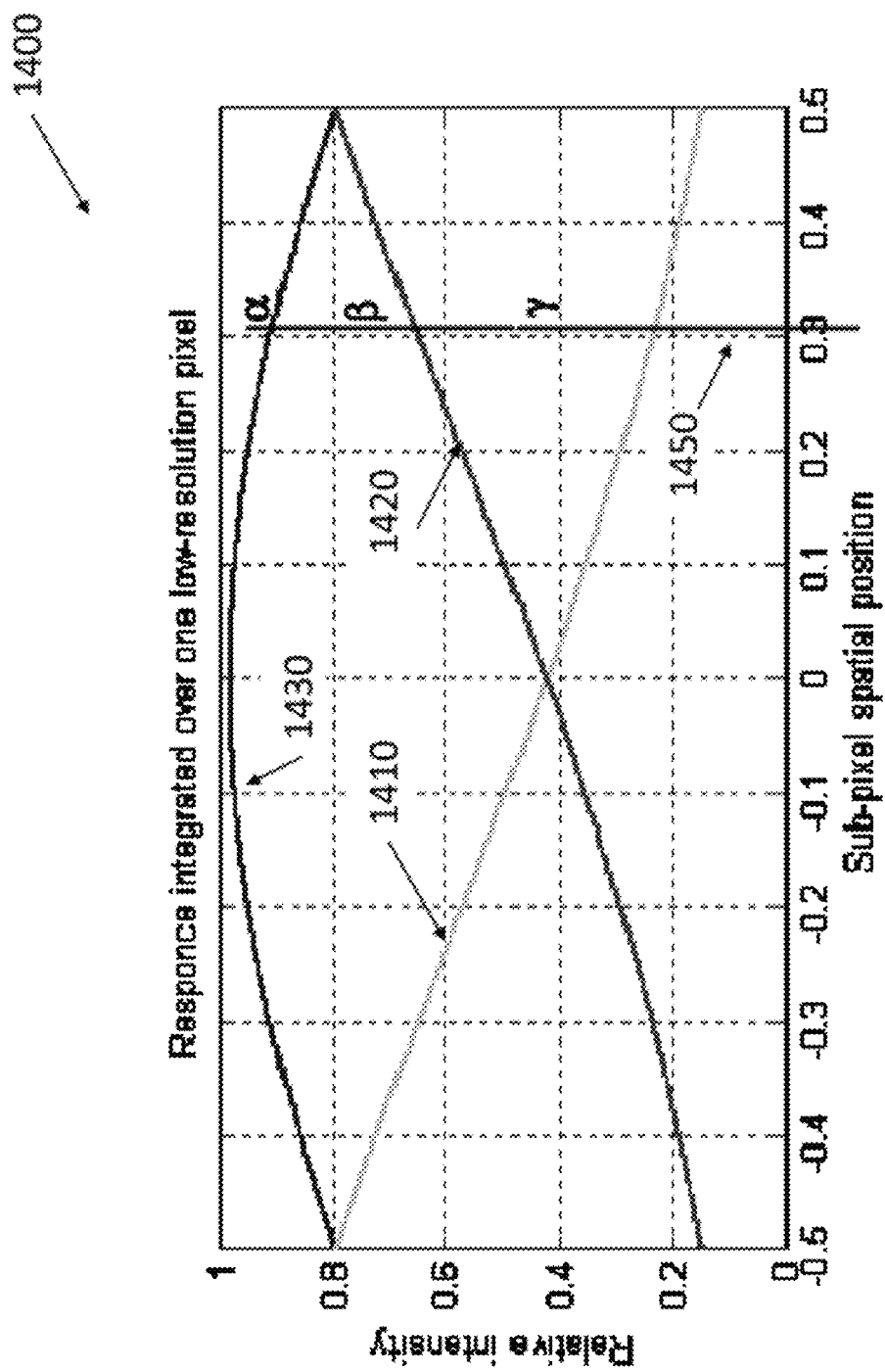
FIG. 14 illustrates a graph displaying a performance of electromagnetic detector sensors according to one embodiment of the invention.

FIG. 14 is an embodiment of the invention shown as system 1400. System 1400 is a graph of intensity vs. sub-pixel location for three adjacent imaging channels or adjacent pixels. Each channel has a tailored response vs. object sub-pixel location. In this example, the curves represent the response when the sampled PSF is moved across the center pixel 1430, across the right pixel 1410 and across the left pixel 1420. Specialized optics code sub-pixel spatial position into intensity within a low resolution pixel or imaging channel. Multiple low-spatial resolution views of object, or pixels, are used to capture high-precision position through spatial intensity coding. Difference in intensity between sampled views determines object sub-pixel spatial resolution. Specialized optics simply code and collect optical power and not image, allowing very fast (<F/1) low complexity optics. As an example, consider an object location 1450. Imaging channels have overlapping fields and produce shifted versions of intensity vs. sub-pixel position. Sampled pixel data is given as y, measured data given as $\alpha$, $\beta$, and $\gamma$.

$$y(x)=\alpha \rightarrow x=y^{-1}(\alpha)$$

$$y(x-1)=\beta \rightarrow x=y^{-1}(\beta)+1$$

$$y(x+1)=\gamma \rightarrow x=y^{-1}(\gamma)-1$$

When the response at each pixel is assumed to be a shifted version of neighboring pixel responses, a high resolution spatial resolution estimate is given by Eq. 2

$$\text{Estimate } x=[y^{-1}(\alpha)+y^{-1}(\beta)+y^{-1}(\gamma)]/3 \quad \text{(Eq. 2)}$$

Figure 15:
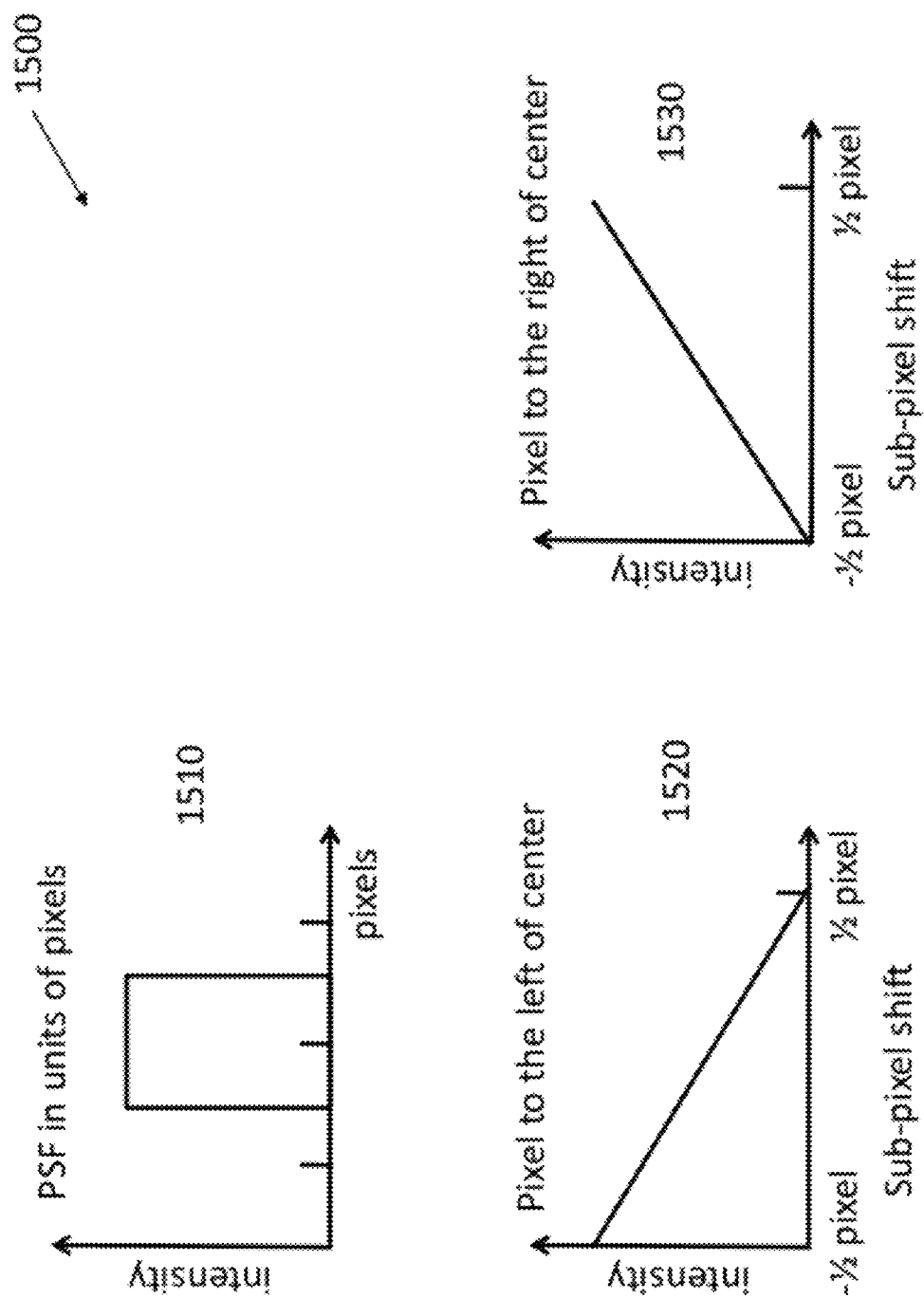
FIG. 15 illustrates graphs displaying a performance of electromagnetic detector sensors according to one embodiment of the invention.

FIG. 15 is an embodiment of the invention shown as system 1500. Optics provide a specialized PSF 1510 that covers more than one pixel. Optics also collect more light than a stopped-down imaging system. The specialized nature of the optics allows optimum sub-pixel spatial resolution with an unknown object. With this type of PSF 1510 the rate of change of integrated photons within one pixel is linear with sub-pixel shift. The pixel information is then a constant for all sub-pixel shifts where the Fisher information is proportional to $[d/d(\text{shift}) y(\text{shift})]^2$. The Fisher information is independent of the particular shift if the partial derivative of the sampled signal is independent of the location of the shift. The sampled PSF linearly changes with the sub-pixel shift. With a PSF of this form, the resulting sampled PSFs as a function of sub-pixel shift 1510 and 1520 are triangular. The derivative of the PSF with sub-pixel shift is then linear.

FIG. 16 is an embodiment of the invention shown as system 1600. PSFs 1630 are close to circular with a circular aperture and close to square with a square aperture. PSFs 1630 are very close but not exact copies each other as shown by spot diagrams 1620 for 0, 10, 20 and 30 deg FOV. The shapes of spot diagrams for a square aperture are shown in 1650 as squares with rounded corners. Optics could be optimized to give identical sampled performance as a function of FOV. Spatially variant processing is also possible. Optics 1610 are F/1.4, f=0.75 mm, TOTR=0.6 mm. The optical material used is KBR, which transmits from visible to long wave IR wavelengths. Pixel size is simulated as equal to the width of the PSF, or about 300 microns. The optical prescription of this system is shown below where dimensions are shown in units of mm.

Ideal sampled pixel output model:
Left pixel output: $y_l(\text{shift})=2^{N}*(1-2*\text{shift})$ |shift|≤1
Right pixel output: $y_r(\text{shift})=2^{N}*(1+2*\text{shift})$ N=sensor bit depth Assuming full well signal
The solution for the shift estimate is then $$\text{Estimate(shift)}=(y_r-y_l)/2*(y_r+y_l)$$

With zero mean noise, the expected values of the sum: and differences are:

$$\text{Expected value}(y_r-y_l)=4*2^{N}*\text{shift}$$

$$\text{Expected value } 2*(y_r+y_l)=4*2^{N}$$

Probability density of $x/y=z$, $f(z)=\int_{-\infty}^{+\infty}|y|f_{xy}(z*y,y)\,dy$ where $f_{xy}$ is the joint probability density of x and y.

| Surf # | Type | Radius | Thickness | Material | Semi-Diameter |
|---|---|---|---|---|---|
| Obj | Standard | Inf | inf | | |
| Stop | Standard | Inf | 0.4 | KBR | 0.2 |
| 2 | Standard | −0.40 | 0.2 | | 0.5 |
| Image | Standard | | | | |

The sampled signals represented by 1640 can be used to estimate object position with a resolution exceeding that of the pixel spacing. A model for the sample pixel output related to 1640 is:

Left pixel: yleft=alpha*(1−2*shift)

Right pixel: yright=alpha*(1+2*shift)

where shift is an unknown value between −½ and ½ and alpha is an unknown scaling constant related to the intensity of the sampled signal. Through sums and differences of the sampled pixel values an estimate of the unknown shift can be found.

The expected value of the sum of the 2 pixel values equals 2*alpha, while the expected value of the difference of the two pixel values (yright−yleft)=4*alpha*shift. The scaled ratio of the difference over the sum then leads to (yright−yleft)/(2*(yright+yleft))=shift which is the unknown value desired.

FIG. 17 is an embodiment of the invention shown as graphs 1710 and 1720. Graph 1710 shows standard deviation of sub-pixel location estimate on a log scale as a function of linear sub-pixel shift and follows the triangular sampled pixel model from above. The shift ranges from −0.5 pixels to +0.5 pixels. In graph 1710, for the ideal detector case we assume Poisson and additive white Gaussian noise statistics. Statistical modeling can be used to understand the system's performance. There are two important cases, when sub-pixel shift=0 then the PSF straddles 2 pixels. When the absolute value of the sub-pixel shift=0.5 the PSF is centered on 1 pixel. If the pixels are the width of the PSF, then in the second case only one pixel receives any signal. With the sample difference over sum estimation algorithm above, the estimation precision, in one dimension, can be greater than $\frac{1}{80}$ of a pixel with 10 bit detector. The maximum value of 1710 is approximately $\frac{1}{80}$, the worst case with shift=0, or when the PSF straddles two pixels. Graph 1720 shows standard deviation of sub-pixel location estimate on a log scale as a function of linear bit depth for the electromagnetic energy detector. Standard deviation of sub-pixel location estimation can be limited only by system SNR.

FIG. 18 comprises graphs 1810 and 1820. Graph 1810 shows an optical system design characteristic with normalized phase in radians, relative to the illumination wavelength, as a function of normalized position on aperture. Graph 1820 shows normalized intensity as a function of normalized spatial location for the impulse response or PSF of the optical system design characteristic in graph 1810. Optical details for the phase function are defined by the 6th order polynomial: $P(x) = -1.5550\ x^6 + 0.0364\ x^5 + 22.0407\ x^4 - 50.1567\ x^3 + 62.5932\ x^2 - 52.4232\ x$. This type of system is useful when location estimation sensitivity is needed to be higher in the center of the FOV, or as a means to flatten the standard deviation of sub-pixel location estimate curves. Example pupil phase function 1810 produces example triangular PSF 1820. When the pixels used are approximately the width of the PSF, the sampled PSF as a function of shift, will have a $2^{nd}$ order contour. Use of polychromatic illumination smoothes the PSF compared to the monochromatic case shown in 1820.

FIG. 19 is an embodiment of the invention shown as processes 1900. Process 1905 includes at least one of (i) first step 1910 comprising a material removal operation, (ii) second first step 1912 comprising a material adding operation, and (iii) third first step 1914 comprising a material coating operation. Material removal may comprise using a diamond tool to cut a metal, ceramic, plastic, amorphous or crystalline material. A material additive operation may comprise adding a polymer to regions where material may be been removed or to adding the polymer to other regions unaffected by material removal. The polymer may then be cured to form a stable material. Curing of polymers to complete the additive step may comprise heating or ultraviolet radiation. One material coating operation may comprise depositing a coating such as, but not limited to, a polymer, insulator, conductor, or surfactant, over a surface of cured polymers or in regions of removed material. For example, vapor depositing a coating material or spraying a liquid carrier or spin-coating a liquid carrier of the coating material may be used. One result of at least one of first step 1910, second first step 1912, and third first step 1914 comprises forming a tool 1922. One tool 1922 may be used in at least one of a second step 1916 of forming a first portion of a lens, a third step 1918 of adding electronics to the first lens portion, and a fourth step 1920 of forming the remaining portion of the lens. The tool 1922 and the steps 1916 and 1918 and 1920 may then be used to form an electric lens 1926 and may be further used in step 1924 to produce multiple electric lenses 1926.

Process 1950 is another embodiment of the invention. One process 1950 comprises tool 1922*a*, which may be approximately the size of a work piece and may produce a large array of lenses 1952*a* using at least one of a substantially simultaneous formation process such as stamping or compression, and a substantially continuous formation process such as rolling. In another process 1950 tool 1922*b* may be smaller than the size of the work piece and may produce a large array of lenses 1952*b* by using a discrete step and form process across the work piece. In yet another process 1950 tool 1922*c* may also operate on a substrate to form electronics 1952*c*.

One step 1918 of adding electronics includes at least one of conductor materials, insulator materials, semiconductor materials, nano-particle materials, encapsulation materials, surfactants and boding agents. Multi-layer metals and semiconductor processes including deposition, annealing and etching may also comprise a portion of step 1918 to form transistors on lens systems. In one embodiment, transistors formed in step 1918 may be used to build memory, logic, and processing in the electric lens. Transistors formed in step 1918 may also be further comprised of transparent materials that, when placed in the regions of lenses, electromagnetic energy is to pass through; and may be comprised of opaque materials when placed in regions where electromagnetic energy is desired to be blocked. Transistors formed in step 1918 may be further configured to affect and modulate the electromagnetic energy and also the electromagnetic channel. Transistors formed in step 1918 may also be further configured to act as at least one of detectors and emitters and electromagnetic energy converters. When formed as electromagnetic energy converters, the transistors may be further configured to harvest energy for storage and also for use by the converters and the electronics.

Devices including the measurement channel 820 in FIG. 8 and apertures 2522 in FIG. 25, as discussed below, gain benefit from the electric lens 1926. Size and efficiency of complex electronic and optical devices may benefit by having electronics positioned on surfaces and within optics and within the volumes within optics. The electric lens 1926 enabled by process 1900 contains electronics including insulators, conductors and transistors in the regions where light does not pass such as behind apertures and light blocks and within lens elements where light traverses a channel volume.

Process 1970 is another embodiment of the invention. In process 1970 tool 1922*d* may form a first portion 1972 of an electric lens 1980 such as optics, and tool 1922*e* may form a second portion 1973 of an electric lens 1980 on the first portion 1972 such as electronics. The second portion 1973 may comprise electronics such as, but not limited to, transparent circuitry, and may be coupled to the first portion 1972 to form at least a partial portion of the electric lens 1980. In process 1970, tool 1922*f* may further form a second electric lens 1982 by forming a second set of optics 1974 on the at least partial portion 1980. The second electric lens 1982 may comprise at least one of a single electric lens 1926 and an array of electric lenses 1926. In one embodiment, first portion 1972, second portion 1973, and second set of optics 1974 may also contain kinematic mounts and structures and kinematic couplings for passive alignment of the portions of electric lens 1982.

Electric lenses 1926 and arrays of electric lenses 1926 may be comprised of a second portion 1973 that is further configured to have transparent detectors form intermediate detection planes. The detection planes may be positioned in regions where signal detection within the lens is desired such as, but not limited to, the image plane on a generalized Shack-Hartmann sensor and in a multifocal ultra-broadband polychromatic imaging system where the wavelengths for detection are focused at varying planes within the detection volume. In another embodiment of electric lenses 1926 that contain detection planes, the detection plane follows a non-planar contour within the lens and detection volume of at least one of a complex contour that reduces aberrations. In another embodiment, the detection plane may comprise a simple curvature that reduces a particular field curvature aberration. Multiple intermediate detection planes in the second portion 1973 may be further configured to operate at different wavelengths to enable electromagnetic energy converters in the detection planes to perform energy harvesting in a different region of the electromagnetic spectrum than the signal detection task operates within.

Electric lenses 1926 and arrays of electric lenses 1926 where the second portion 1973 is further configured to have transparent conductors also produce polarization effects. Electric lenses 1926 and arrays of electric lenses 1926 may be further configured to be a variable index of refraction (VIN) lens. The VIN lens may be enabled to have a volume-varying index of refraction due to step 1924 and precision of tool 1922. Repeating step 1924 using nano-particles, nano-voids, and nano- and microstructures where at least one of the material and the material properties are varied within a volume of the electric lens 1926 may provide a volume varying index of refraction. Such materials within the electric lens 1926 cooperate in one embodiment to form a meta-material VIN electric lens 1926. The electric lens 1926 may be further configured to contain an internal baffle or aperture or stop substantially on or within at least one of first portion 1972, second portion, 1973, and second set of optics 1974 by including varying volumes of opaque materials using step 1924. An internal stop may provide an aperture that is not necessarily planar and is enabled to vary within the volume of the electric lens 1926 due to the precision of tool 1922 and step 1924.

FIG. 20 is an embodiment of the invention shown as system 2000. System 2000 comprises base 2010, work spindle 2011, and tool spindle 2014 with tool 2015. Motion of tool spindle 2014 is through rotation command 2031 with rotation feedback 2032. Motion of tool spindle 2014 is also through translation command 2024 with translation feedback 2034 and through translation command 2026 with translation feedback 2036. Motion of work spindle 2011 is through rotation command 2020 with rotation feedback 2030. Motion of work spindle 2011 is also through translation command 2028 with translation feedback 2038. In one embodiment, measurement system 2090 is mounted to the tool spindle 2014 and reference marks 2092 are placed on work piece 2012 and illuminated with illuminator 2022. Measurement system 2090 provides measurements 2080 by measuring the locations of the reference marks 2092. Servo 2070 uses commands 2040, measurements 2050, 2080 and knowledge of reference mark 2092 location to produce desired output signals 2060. Measurements 2050 are obtained by translation feedback 2036, 2034 and 2038 and rotation feedback 2030 and 2032. Measurement system 2090 also provides measurements 2080 by measuring the locations of the reference marks 2092 and having knowledge of reference mark 2092 locations and providing a computed value based on the measurements and known locations. Output signals 2060 drive motions of the work spindle 2011 and tool spindle 2014, which may be referred to as adjustment devices. Work piece 2012 is mounted to work spindle 2011 and operated on using tool 2015 to form features 2013. Work piece 2012 is also measured for form and location in-situ while mounted on work spindle 2011.

The relative size of the work piece 2012 and tool 2015 plays a role in the efficiency of system 2000. The physical size of the work piece 2012 is, for example, large compared to tool 2015. The work spindle 2011 and tool spindle 2014 cooperate to bring tool 2015 within reach of the entire work piece 2012. Closed loop control and specialized reference marks enable nano-precision alignment of small (centimeters) and large (10's of meters) structures. In an embodiment, servo 2070 performs closed loop control in system 2000 by controlling the relationship between the tool 2015 and the work piece 2012 to within lambda/10 where lambda is the working range of wavelengths of the device being formed in system 2000. In another embodiment, the physical size of the work piece 2012 is similar to tool 2015 and the work spindle 2011 and tool spindle 2014 cooperate to bring tool 2015 in accurate location to the work piece 2012, enabling the location of multiple devices that can be measured and then aligned to each other. In such an embodiment, multiple devices fabricated on a single substrate are ideally aligned with a single element wherein each device is in sufficient alignment and does not require a new alignment.

FIG. 21 is an embodiment of the invention shown as systems 2110, 2140 and 2160. In system 2110, the work piece 2112 is oriented such that gravity 2114 is arranged to be orthogonal to the plane of work and parallel to the tool and tool spindle axis of rotation. In system 2140 tool 2142 is oriented such that gravity 2144 is orthogonal to the plane of work enabling a uniform gravity field across the tool 2142. The tool 2142 is, for example, approximately the size of the work piece and is a stamp with a curable substance suspended on the top portion, to be pressed into a work piece. In system 2160, tool 2162 and work piece 2166 are oriented such that gravity 2164 is orthogonal to the plane of work enabling a uniform gravity field across the work piece 2166. The tool 2162 is, for example, smaller than the work piece 2166 and may be a stamp that will be stepped across the work piece 2166. The work piece 2166 is, for example, coated with a curable substance to be pressed into a work piece 2166 using tool 2162.

In one embodiment, the parts being placed by tools 2142 and 2162 have kinematic mounts and structures (as described below) formed on the parts to hold and position parts accurately and passively with respect to each other. In another embodiment, the tools 2142 and 2162 have kinematic mounts and structures formed on the tools to hold and position parts accurately and passively with respect to the tools. In another embodiment, tool 2142 is adapted to place multiple substrates in contact with each other, using active alignment of reference marks on each substrate and bonding substrates together. In such an embodiment, the alignment during bonding is monitored and controlled. In another embodiment, tool 2142 is adapted to place multiple substrates in contact with each other, using (i) passive alignment of kinematic alignment mounts and structures, (ii) kinematic couplings on each substrate to maintain alignment, and (iii) bonding substrates together.

FIG. 22 is an embodiment of the invention shown as system 2200. System 2200 comprises base 2210, motion platform 2215 and construct 2211. Motion of platform 2215 is through rotation command 2231 with rotation feedback 2232. Motion of platform 2215 is also through translation command 2224 with translation feedback 2234 and through translation command 2226 with translation feedback 2236. In one embodiment, measurement system 2290 is mounted to a rigid construct 2211 and reference marks 2292 are placed on work piece 2212 and illuminated with illuminator 2222. Measurement system 2290 provides measurements 2280 by measuring the locations of the reference marks 2292. Servo 2270 uses commands 2240 and error signals 2250 to produce references for measurements 2280 with respect to work piece 2212 location. Output signals 2260 drive motions of the motion platform 2215.

FIG. 23 is an embodiment of the invention shown as system 2300. System 2300 shows tool spindle 2311 with at least one of a flat work piece 2301, a curved work piece 2302, a multi-segmented work piece 2303, and an annular work piece 2304. Flat work piece 2301 is generally planar and contains features 2313 and reference marks 2392. Curved work piece 2302 is generally curved and contains features 2313 and reference marks 2392. Multi-segmented work piece 2303 is generally multi-segmented and contains features 2313 and reference marks 2392 on at least one of the segments. Work piece 2304 is generally annular and contains features 2313 and reference marks 2392 on at least one of the interior and exterior of the work piece. Features 2313 are at least one of an optical surface, an optical structure, a refractive and diffractive surface form, a kinematic mounting structure and a secondary reference mark. References 2313 may be formed as a secondary reference mark by system 2000. In such an embodiment, the system 2200 in FIG. 22 may be enabled to measure reference marks 2392 and secondary reference marks to form precision relationships between reference marks 2392 and secondary reference marks placed on the work piece 2303 and reference marks 2392 and secondary reference marks formed in the work piece 2303.

FIG. 24 is an embodiment of the invention shown as process 2400. In one process, reference marks 2420 are placed on work piece 2410. Reference marks 2420 may comprise a variety of designs and may be distributed by placement 2430 and may be coupled to the work piece 2410. Referenced work piece 2430 with affixed reference marks 2432 may then be characterized by measurement system 2440. Measurement system 2440 may produces measurements 2450 that contain precision reference mark location information. Precision reference mark location information in measurements 2450 may then be passed to system 2460 for operation on work piece. System 2460 may produce features 2466 in precise locations by measuring reference marks 2468 and using knowledge of measurements 2450. System 2460 may comprise, for example, a milling machine, a diamond turning machine, a nano-imprint machine, and a replication machine—for example, a DVD or CD fabrication machine that replicates DVDs and CDs. Measurements in system 2460 may be acquired using measurement system 2462 which may be referenced to tool spindle 2464. In one embodiment at least one of the reference marks 2432 placed on the work piece 2430 are modified such as, but not limited to, by removal or reshaping during processing by system 2460.

In another embodiment, measurement 2452 of the reference mark 2420 location information is available from the placement process 2430. The referenced work piece 2430 is processed directly by system 2460 by taking path 2490 and providing the measurements 2452 to system 2460. In another embodiment, the referenced work piece 2430 may be removed from system 2460 and remounted with registration errors on the order of the precision of the measurement systems. In a further embodiment, reference marks 2420 may be re-placed on the removed referenced work piece 2430 and the re-referenced work piece 2430 may be remounted with registration errors on the order of the precision of the measurement systems. In a further embodiment, reference marks 2420 may be re-placed on the removed work piece 2430, the reference marks 2420 may be re-measured by system 2440, and the work piece 2430 may be remounted with registration errors on the order of the precision of the combined measurements of systems 2440 and 2460. In yet a further embodiment, the work piece may undergo different processes between removal, re-placing, re-measuring and re-mounting to include at least one of the steps of coating, overlaying, doping, etching, annealing, depositing, and conformal coating. In still yet another embodiment, machines that perform different processes between removal and re-mounting may be equipped with measurement systems for measuring reference marks 2420 and sharing work pieces 2410 that are of approximately the same precision as obtained with systems 2440 and 2460.

FIG. 25 is an embodiment of the invention shown as system 2500. System 2520 displays a layout of such an embodiment comprising an ultra-compact 36 Mpixel 2 pi steradian imaging system with F/4.0 nominal design for each imaging channel. One performance goal of the system 2500 is near diffraction-limited imaging of all channels. The design MTF vs. field angle for a single channel of this system 2500 is shown in graph 2550. Single optical element 2521 may comprise aspheric front and back surfaces and apertures 2522. As seen in FIG. 25, optically precise monolithic opaque detector mounting element 2526 may be coupled to a back surface of the single optical element and may provide spacing between (i) optics on optical element 2521, (ii) electromagnetic energy detectors 2528, and (iii) a field opening 2532 with a detector mounting region 2534. Wiring 2530 may comprise, for example, a flex cable to interconnect the detectors 2528. Wiring 2530 can also be electrical conductors directly formed on 2521 through additive nano-imprint methods with conductive materials. Wiring and electrical conductors may be referred to as a signal reception device. Passive sub-micron assembly 2536 maintains tolerance between apertures 2522, optics 2521, spacer 2526 and detectors 2528 via kinematic couplings 2524.

System 2505 comprises a side view of system 2520. Single optical element 2510 comprises aspheric front surfaces 2514 and aspheric back surfaces 2516. Substrate 2511 comprises electronics, cooling, and power systems. Volume 2512 comprises in one embodiment electronics for processing and communication. Electromagnetic energy detectors 2513 communicate with electronics in void 2512. Spacer 2518 separates detectors 2513 from optic 2510.

The precision from closed-loop control enable the fabrication of not only precise optics, but also optically precise mounting features 2524 between the optics and the monolithic detector mounting element 2526. Designing and fabricating nanometer precision kinematic couplings fabrication enables passive alignment/assembly of these 3D imaging systems. The individual parts of system 2520 include planar and non-planar parts with planar and non-planar regions. Planar parts may comprise electromagnetic energy detectors 2513 and substrate 2511. Non-planar parts may comprise apertures 2522 and single optical elements 2521. In this embodiment, detector mounting element 2526 may comprise a non-planar part that includes planar regions for mounting of planar electromagnetic energy detectors 2513. In one embodiment, the planar regions in detector mounting element 2526 may be precision fabricated to provide passive alignment in at least three degrees of freedom for the electromagnetic energy detectors 2513.

FIG. 26 is an embodiment of the invention shown as systems 2600. System 2610 comprises electronics 2612 and common optics 2614 configured as an optics and electronics sandwich. Field of view of system 2610 is narrow vertically and 360 degrees horizontally. The object and image resolution depends on the diameter of the common optics 2614. System 2620 comprises a stack of systems 2624 with communications 2622 and energy harvesting 2626 and mounting 2628. Systems 2624 are similar to systems 2610 being formed as an optics 2614 and electronics 2612 sandwich. System 2640 is an annular common optic 2642 with optical features 2644. This system 2640 can view objects external to the convex surface, such as 2610, or internal to the concave surface. When imaging with the concave surface, the system 2640 can image with high magnification due to the small relative distances. System 2660 comprises a planar embodiment comprising a protective layer 2662, an aperture layer 2664 with apertures 2665, a light modification layer 2666 with features 2667 containing at least one of a refractive form and diffractive form to modify light, and an electronics layer 2670 containing electromagnetic energy detectors 2672 and processing electronics 2674. Protective layer 2662 may contain micron and sub-micron objects that may be imaged or interrogated. System 2660 may be used to detect, classify and count a variety of objects commonly found in biomedical screening applications.

FIG. 27 comprises an embodiment of the invention shown as process 2700. In one embodiment, step 2710 comprises a step of alignment where multiple objects may be aligned and step 2720 may comprise the step of bonding which includes at least one of heat and ultra-violet curing and compression. In another embodiment, process 2700 is a material addition process to add insulators and conductors whereby step 2710 may add a conductor layer and step 2720 may add an insulating layer. In one embodiment, the insulation layer may cover the entire conductor layer. In another embodiment, the insulator layer may cover the conductors while leaving some regions uncovered. In another embodiment, the conductive and insulating layers are at least partially transparent.

In one embodiment, the process 2700 includes an additional step 2710 of adding at least one of conductors, insulators and semiconductors and the step 2720 may further comprise adding optics. In regions where step 2720 is adding optics, the materials in step 2710 that may be added to light-blocking regions have properties that are indifferent to the presence of the particular wavelengths of light being used. In one embodiment in regions where step 2720 is adding optics, the materials in step 2710 that are added to light-passing regions may have properties that are sensitive to the presence of particular wavelengths that may be implemented. In another embodiment, in regions where step 2720 is adding optics, the materials in step 2710 that are added to light-passing regions may have properties that are insensitive to the presence of the wavelengths being used. In yet another embodiment, in regions where step 2720 is adding optics, the materials in step 2710 that are added to light-passing regions may have properties that modulate the presence of light. In still yet another embodiment the steps 2710 and 2720 may operate with similar materials.

FIG. 28 is an embodiment of the invention shown as system 2800. System 2800 describes low-cost system design and fabrication for a three element Long Wave Infra-Red ("LWIR") imaging system. System 2800 contains at least one of a first substrate 2810 and a second substrate 2820. First substrate 2810 may comprise a clear aperture 2812. Second substrate 2820 may comprise multiple clear apertures 2822. System 2800 may be further comprised of bonded substrates 2830 with low cost replicable IR optics 2832 in a total package length 2834. System 2800 may comprise F1.4, f=9.75 mm, DFOV=53 degrees, CRA=27 degrees. The low-cost replicable IR optics in system 2800 changes the economics of IR optics while allowing future IR systems that are more compact. The low-cost nature is related to low-cost materials and the potential ability to scale the process to a degree similar to wafer scale optics used in cell phone and other consumer electronic applications. Low cost materials to form low cost replicable IR optics 2832 for system 2800 include halides which are compression molded as well as diamond turned and ground, have a very broad transmission spectrum. For example, KBr spectrum is visible to ~20 microns, can have dn/dt far less than Ge and be 10× less sensitive than Ge. In one embodiment, halides and low cost replicable IR optics in system 2800 made from halides are encapsulated and coated to eliminate moisture absorption. In one embodiment of system 2800 each of the low cost replicable IR optics 2832 is molded within a glass substrate 2830. In another embodiment, low cost replicable IR optics 2832 can be within outer plane of substrate 2830 in order to function as a spacer to next low cost replicable IR optics 2832. In another embodiment, alignment marks are positioned on each substrate 2830 and used to position lens on each substrate 2830 and substrate-to-substrate bonding. Substrate 2830 may also comprise first substrate 2810 for a single set of IR optics 2832; substrate 2830 further comprises second substrate 2820 for an array of IR optics 2832.

Process 400 in FIG. 4 may be suitable for forming precision first substrate 2810 and second substrate 2820. Registration between adjacent clear apertures in second substrate 2820 is held to precision by system 400, measured in-situ by system 400. For example, in system 400, locations of first and second substrates 2810, 2820 may be measured by measurement systems 460 and 470. Tool holder 420 holds tool 430 that grasps and positions the first substrate 2810 and work piece 405 is replaced with second substrate 2820. Measurement systems 460 and 470 provide location relationship between first and second substrates 2810 and 2820 to enable precision registration and assembly of the two substrates. In another embodiment, confirmation of registration and assembly precision may be provided by measurement system 300 in FIG. 3. Precision processing of clear apertures 2812 and 2822 by system 400 may include the steps of forming overflow features to allow excess volume of lens material to move away from the clear aperture during compression and curing.

FIG. 29 comprises a graph 2910 showing MTFs across field for a low-cost Infra-Red ("IR") replicable system 2800 in FIG. 28. As seen, one embodiment has good performance across field angle and is also low cost. The performance in graph 2910 is for system 2800 in FIG. 28 based on KBr optics and shows high monochromatic MTFs@10 microns with axial chromatic effects controlled via computational imaging.

FIG. 30 is an embodiment of the invention shown as system 3000. In one example, precise milling may be used to form IR masters 3040 where the masters 3040 are comprised of ductile metals which may be too soft for reliable compression molding. Masters 3040 may be used sparingly so that only one set is needed for the commercial lifetime of a product. This may lead to forming copies of masters 3040, or daughters 3042 from milled masters 3040, and from daughters 3042 are formed tools 3045 that may be used in compression molding. The daughters 3042 can be formed from a "model making" process with commercial polymers. Liquid polymer closely contours to the original master 3040 forming a rigid and accurate daughter 3042 from the master 3040.

In one embodiment, in order to make the daughter 3042 rigid and reliable for compression molding, the daughter 3042 may be coated via electroformed Ni 3043. This coating may be strong, from <01 mm to 100 mm thick, and accurate to better than ½ a micrometer. After placing a stiff backing 3044 on the daughter/Ni combination, a compression tool 3045 may be formed. This compression tool 3045 may be used to make lenses 3060. In one embodiment, compression tool 3045 may undergo a full 3D metrological characterization or measurement. In another embodiment, compression tool 3045 may undergo a sampled 3D metrology characterization or measurement.

In one embodiment, individual lenses 3062 may be formed within voids 3022 of a lens substrate 3020. Voids 3022 may be referred to as regions elsewhere in the specification. Alternatively, voids 3022 may also be formed within regions such as, but not limited to regions 210. The lens substrate material 3010 may comprise, for example, a float glass, where voids 3022 may be placed approximately at a lens 3062 location. Such materials are good substrates 3020 as they are inexpensive, flatness can be sufficient for tolerance budget in LWIR wavelengths and easily sourced. This type of material is also opaque at LWIR wavelengths offering ready apertures and stray-light blocks. In one embodiment, the molded lenses 3062 are held by compression and automatically bonded to the inside edges and flange areas of the substrate 3064.

The compression tool 3045 contains lenses 3062 with volumes of halide material 3030 that are not exact. Therefore, over-fill and under-fill are accommodated in the tool design. The compression molding process 3048 may be controlled by compression rate and period. Dispensing of Halide material 3030 onto substrate 3050 may be automated. In another embodiment, the material 3030 may be formed into rough moldable blanks and mixed with a solvent forming a viscous liquid that can be "jetted". Drying of the solvent may be required before molding. In another embodiment, the compression tool 3045 compensates for variations of compression forces in the compression molder. The compression tool 3045 is preferably able to withstand the repeated application 3048 of compression forces so that multiple lenses 3062 and lens wafers can be made from one tool 3045. In another embodiment, a release mechanism or process is employed so that the lens wafers can be released from the molder without reducing yield.

In one embodiment, halides may be hydroscopic and encapsulated 3066 for protection from moisture and to make the material more robust to mechanical/environmental conditions. Commercially available encapsulation materials and processes such as Zinc Selenide and Parylene may be used. In another embodiment, encapsulation 3066 may be achieved by using LWIR polymer sheets in the compression molding process. Polymer materials such as PVDC (polyvinylidene chloride) or PE (polyethylene) when used in thin sheets may encapsulate the lenses and lens wafers. The thin sheets, similar in concept to "Saran Wrap®", may be placed between the Halide material 3030 and the compression tool 3045 and form a environmental barrier during the compression step. The use of polymers may be performed by compression molding in a vacuum to remove the air that may be trapped by the polymer.

FIG. 31 is an embodiment of the invention shown as system 3100. Planar IR arrays 3155 with process 3144 and assembly and testing lowers cost; non-planar mastering and process assembly provides low-cost and compact 3D IR optical systems for a variety of applications. Compression molding of Halides and high volume assembly of lens stacks 3180 using wafer-level handling, coating, bonding and testing may be used when yearly unit volumes reach suitable levels to justify increasing automation thereby lowering cost. Masters may be milled arrays of lens forms with additional reference marks 3172 for alignment and metrology. Substrates 3120 may contain reference marks 3192 and 3172 for alignment and metrology. In another embodiment, the reference marks 3192 on the masters comprise the reference marks 3192 on the substrates.

Mastering of lens arrays for visible light wafer scale cameras is a considerable challenge due to limited milling precision compared to a 0.5 micron wavelength. For IR camera systems, and an implicit 20× increase in wavelengths, state-of-the-art milling precision is sufficient to ensure that planar masters for IR lens plates should be within lambda/10 or 1 micron rms over the area of nominal sized masters. Complete 3D master metrology is used to fully characterize the relative and individual form, location, and error of the entire master. Extending this capability to large areas of arrays that are 10× larger than nominal sized masters is enabled by system 400 in FIG. 4 for processing a larger area of planar arrays 3155. System 300 in FIG. 3 enables complete 3D master metrology to fully characterize the relative and individual form over the larger area of processing enabled by system 400. Systems 300 and 400 further enable high precision IR mastering for system volumes such as the system 2520 in FIG. 25.

In one embodiment, a blank substrate 3110 may be provided with reference marks 3192 and holes 3122 to form an array substrate 3120. Material 3130 and array substrate 3120 may be placed between tooling 3145 and undergo compression process 3144. In one embodiment, reference marks 3192, 3150 and 3151 are used for alignment during the compression process 3144. In one embodiment, formed optical wafer 3155 is at least one of coated and encapsulated with barrier encapsulation 3156. A wafer stack 3170 may be formed by alignment using alignment marks 3172 and bonding lens wafers 3155 and spacer wafers that are similar to lens wafers 3155. In another embodiment, specialized metrology and measurement as part of the aligning and bonding process is used in forming a manufacturing model.

In another embodiment, the optical wafers 3155 with barrier encapsulation 3156 are cingulated through the operation of dicing to form lenses 3160 with lens elements 3162 bonded to substrates 3164. The aligned and bonded optical wafers 3155 in stack 3170 are cingulated through the operation of dicing to form lens stack 3180. High volume dicing is very precise with dicing line width of 20-50 microns. Use of glass substrates for the lens and spacer wafers does not expose halide material to the diced face.

The complexity of lens stack 3180 and detector die assembly is dramatically reduced from that required in visible light wafer scale cameras. Due to tolerance stack up just from the thickness, tolerance of wafer substrates all visible light detectors have a back focal length variation that is long compared to the depth of focus tolerance. In one embodiment, with the 20× implicit increase in precision (or increase in wavelength) with LWIR systems, substrate 3110 thickness variations are controlled to such a degree that substantially no type of focusing is required. This leads to a significant decrease in assembly process complexity and therefore an increase in speed of bonding lenses and IR detector die compared to visible light systems.

What is claimed is:
1. A measurement system comprising,
a first set of a plurality of imaging channels having overlapping fields of view, wherein each imaging channel of the first set of plurality of imaging channels provides a difference in intensity verses an angular position of at least one first measured object and comprises, infinity corrected and intensity coded optics adapted to receive light comprising information about the at least one first measured object, the infinity corrected and intensity coded optics comprising an exit pupil, a micro lens array adapted to receive at least a portion of the light from the exit pupil and emit focused light, and one or more electromagnetic energy detectors adapted to receive the emitted focused light from the micro lens array; and at least one second set of plurality of imaging channels having overlapping fields of view, wherein each imaging channel of the at least one second set of plurality of imaging channels provides a difference in intensity verses an angular position of at least one second measured object and comprises, infinity corrected and intensity coded optics adapted to receive light comprising information about the at least one second measured object, the infinity corrected and intensity coded optics comprising an exit pupil, a micro lens array adapted to receive at least a portion of the light from the exit pupil and emit focused light, and one or more electromagnetic energy detectors adapted to receive the emitted focused light from the micro lens array.

2. The measurement system of claim 1 wherein, the light from the exit pupil comprises complex light;

the micro lens array is further adapted to separate complex light onto separate regions of the one or more electromagnetic energy detectors; and the one or more electromagnetic energy detectors are adapted to operatively create a spatially coherent imaging configuration of at least one of, the at least one first measured object, and the at least one second measured object.

3. The measurement system of claim 1 wherein, each of the plurality of imaging channels, form spatially coherent measurements of at least one of, the at least one first measured object, and the at least one second measured object; and at least one of, comprise generalized Shack-Hartmann implementations that provide both phase and amplitude measurements, are adapted to provide at least one of, a spatially coherent measurement of phase and amplitude, and provide a spatially coherent measurement field of view of phase and amplitude greater than 15 degrees.

4. A measurement system comprising, intensity coding optics comprising a plurality of imaging channels with overlapping fields of view, the intensity coding optics adapted to provide intensity coded information indicative of a position of one or more objects, wherein each of the imaging channels provides a difference in intensity verses an angular position of the one or more objects;

an electromagnetic energy detector comprising at least one pixel and adapted to, receive the intensity coded information, wherein the at least one pixel comprises a size larger than a spatial resolution of the intensity coding optics, and output data from the at least one pixel; and a processing device adapted to receive the data and determine the position of the one or more objects.

5. The measurement system of claim 4 wherein, the intensity coding optics comprise multi-aperture optics.

6. The measurement system of claim 5 wherein, the multi-aperture optics comprise at least one of planar and three-dimensional optics.

7. The measurement system of claim 4, further comprising a plurality of pixels; and wherein, a density of the one or more objects is matched to a density of the plurality of pixels.

8. An imaging system comprising, an optical element adapted to provide intensity coded information indicative of a position of a measured object, the optical element comprising optics, a plurality of imaging channels with overlapping fields of view, each of the plurality of imaging channels providing a difference in intensity verses an angular position of the measured object, and a non-planar surface comprising a front surface, a back surface, and one or more apertures;

one or more electromagnetic energy detectors operatively coupled to the back surface, each of the one or more electromagnetic energy detectors being electronically coupled to a signal reception device;

a field opening with a detector mounting region operatively coupled to the back surface;

a mounting element coupled to the back surface, the mounting element adapted to provide spacing between the optics, the one or more electromagnetic energy detectors, and the field opening with the detector mounting region; and an assembly comprising one or more kinematic couplings adapted to maintain tolerances between the optical element, the one or more electromagnetic energy detectors, the mounting element, and the one or more apertures.

9. The imaging system of claim 8 further comprising at least one of, a substrate comprising electronics and one or more cooling systems and power systems; and a volume comprising electronics for processing and communication.

10. The imaging system of claim 8 wherein, the one or more electromagnetic energy detectors comprise substantially planar electromagnetic energy detectors; and the one or more apertures comprise non-planar one or more apertures.

* * * * *